US012568664B2

(12) United States Patent
Lu et al.

(10) Patent No.: US 12,568,664 B2
(45) Date of Patent: Mar. 3, 2026

(54) SEMICONDUCTOR DEVICE AND METHOD OF MANUFACTURING THEREOF

(71) Applicant: Taiwan Semiconductor Manufacturing Company, Ltd., Hsinchu (TW)

(72) Inventors: Min-Hsuan Lu, Hsinchu City (TW); Kan-Ju Lin, Kaohsiung City (TW); Lin-Yu Huang, Hsinchu (TW); Sheng-Tsung Wang, Hsinchu (TW); Huan-Chieh Su, Changhua County (TW); Chih-Hao Wang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 608 days.

(21) Appl. No.: 17/844,044

(22) Filed: Jun. 19, 2022

(65) Prior Publication Data

US 2023/0411457 A1     Dec. 21, 2023

(51) Int. Cl.
| *H10D 62/13* | (2025.01) |
| *H10D 30/01* | (2025.01) |
| *H10D 30/62* | (2025.01) |
| *H10D 62/83* | (2025.01) |
| *H10D 64/23* | (2025.01) |

(52) U.S. Cl.
CPC ........... *H10D 62/151* (2025.01); *H10D 30/01* (2025.01); *H10D 30/6219* (2025.01); *H10D 62/8303* (2025.01); *H10D 64/258* (2025.01)

(58) Field of Classification Search
CPC .. H10D 62/151; H10D 30/01; H10D 30/6219; H10D 62/8303; H10D 64/258
See application file for complete search history.

(56) References Cited

U.S. PATENT DOCUMENTS

| 2018/0033866 A1* | 2/2018 | Liao | ................. H01L 21/28123 |
| 2019/0148226 A1* | 5/2019 | Yim | ................. H01L 21/76876 |
| | | | 257/383 |
| 2021/0134973 A1* | 5/2021 | Huang | ................. H10D 30/024 |

* cited by examiner

*Primary Examiner* — Jay C Kim
*Assistant Examiner* — Woo K Lee
(74) *Attorney, Agent, or Firm* — JCIPRNET

(57) ABSTRACT

A semiconductor device and a method of manufacturing thereof are provided. The semiconductor device comprises a gate stack, source/drain regions, and a source/drain contact via. The gate stack is disposed on a substrate. The source/drain regions are disposed on the substrate and located at opposite sides of the gate stack. The source/drain contact via penetrates through the substrate and is electrically connected to a first source/drain region among the source/drain regions. The source/drain contact vias comprise a first conductor and a second conductor disposed on the first conductor. The first conductor comprises a silicide layer and a first metallic portion. The second conductor comprises a glue layer and a second metallic portion. The first metallic portion is spaced apart from the second metallic portion by the glue layer.

20 Claims, 36 Drawing Sheets

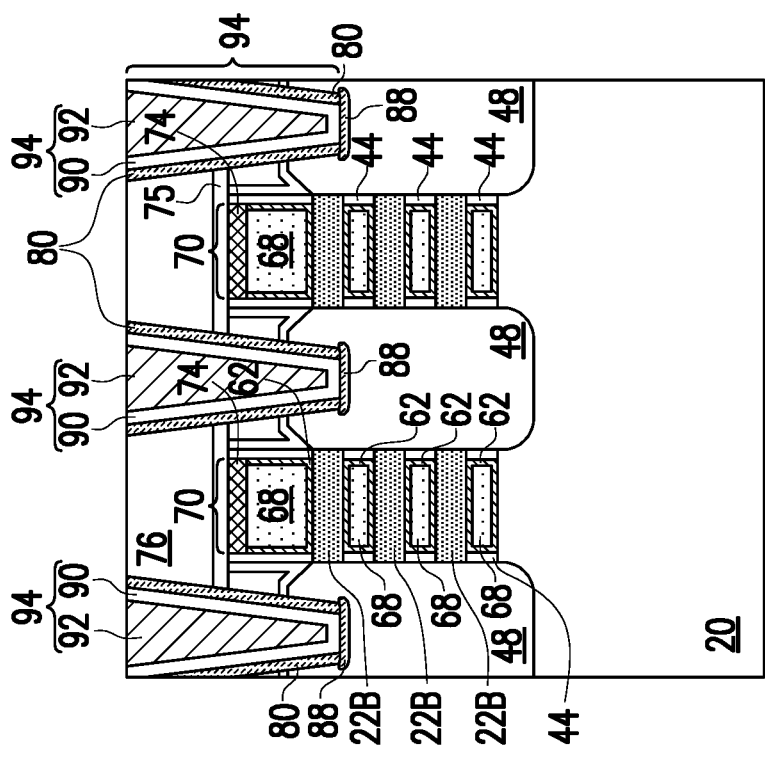
FIG. 23B
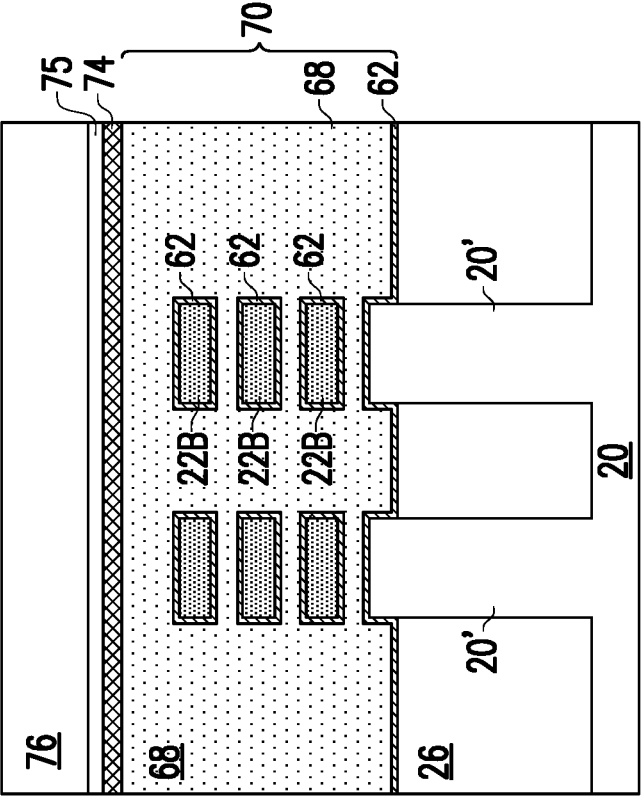
FIG. 23A

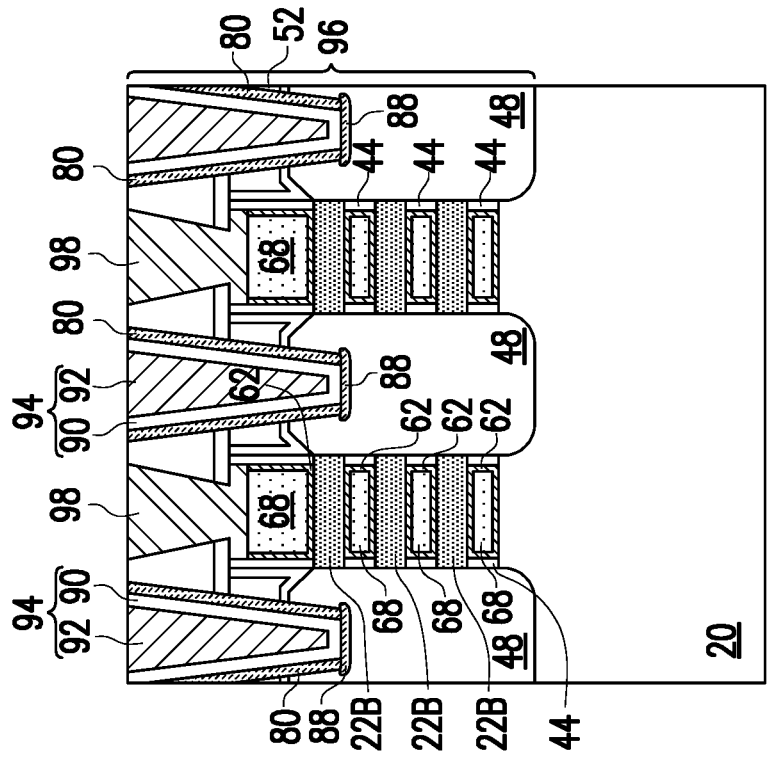
FIG. 24B
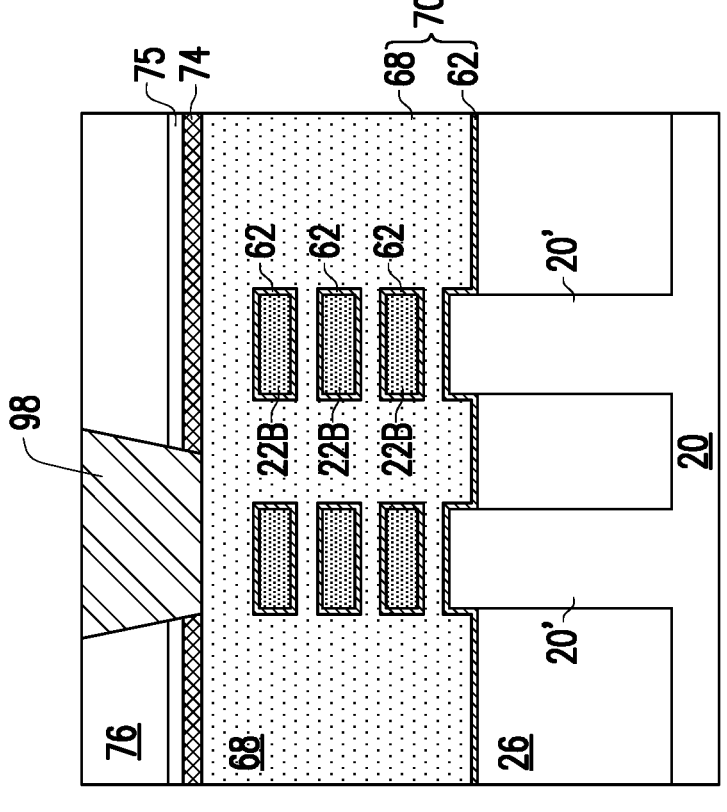
FIG. 24A

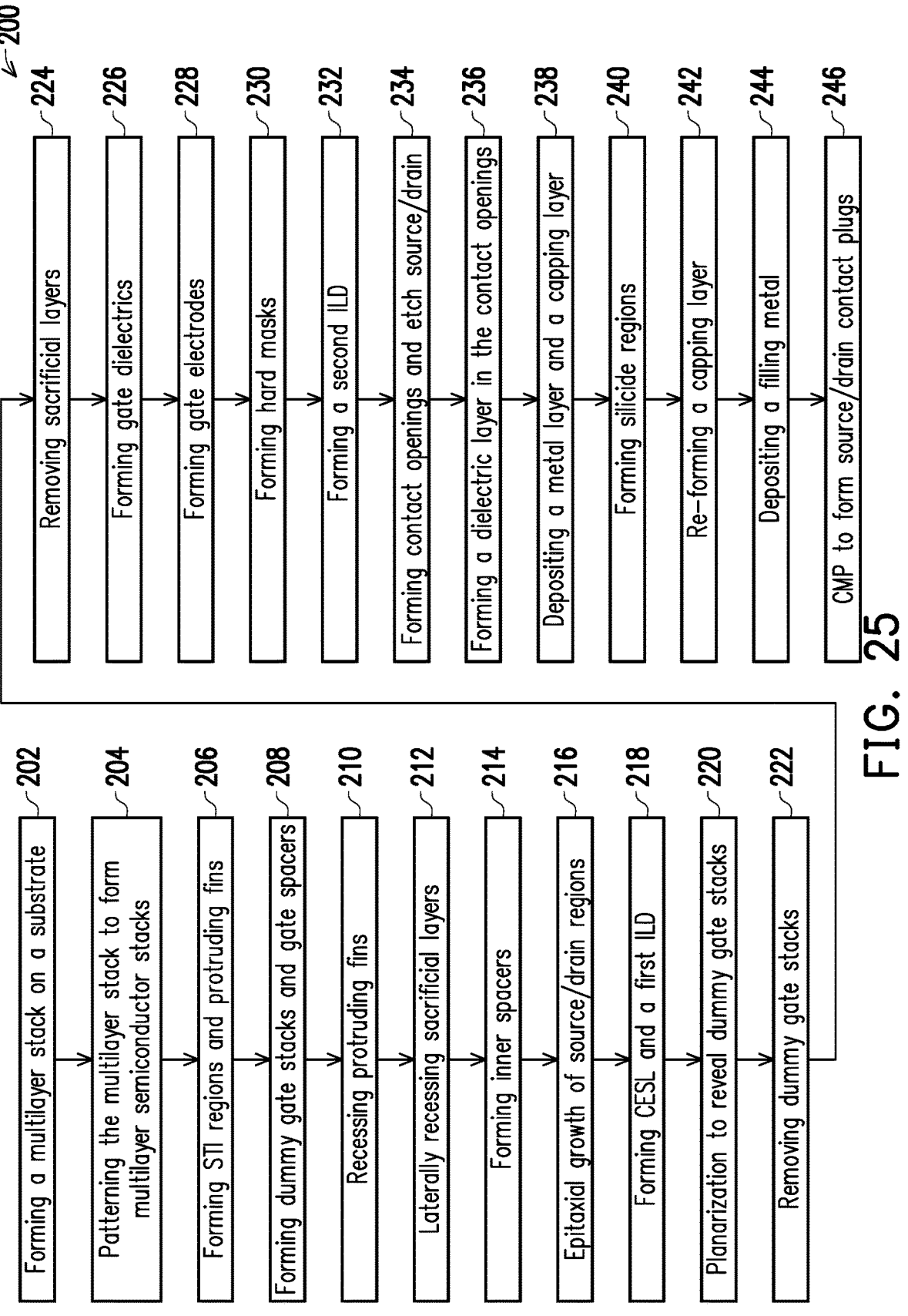

200

202 Forming a multilayer stack on a substrate

204 Patterning the multilayer stack to form multilayer semiconductor stacks

206 Forming STI regions and protruding fins

208 Forming dummy gate stacks and gate spacers

210 Recessing protruding fins

212 Laterally recessing sacrificial layers

214 Forming inner spacers

216 Epitaxial growth of source/drain regions

218 Forming CESL and a first ILD

220 Planarization to reveal dummy gate stacks

222 Removing dummy gate stacks

224 Removing sacrificial layers

226 Forming gate dielectrics

228 Forming gate electrodes

230 Forming hard masks

232 Forming a second ILD

234 Forming contact openings and etch source/drain

236 Forming a dielectric layer in the contact openings

238 Depositing a metal layer and a capping layer

240 Forming silicide regions

242 Re-forming a capping layer

244 Depositing a filling metal

246 CMP to form source/drain contact plugs

FIG. 25

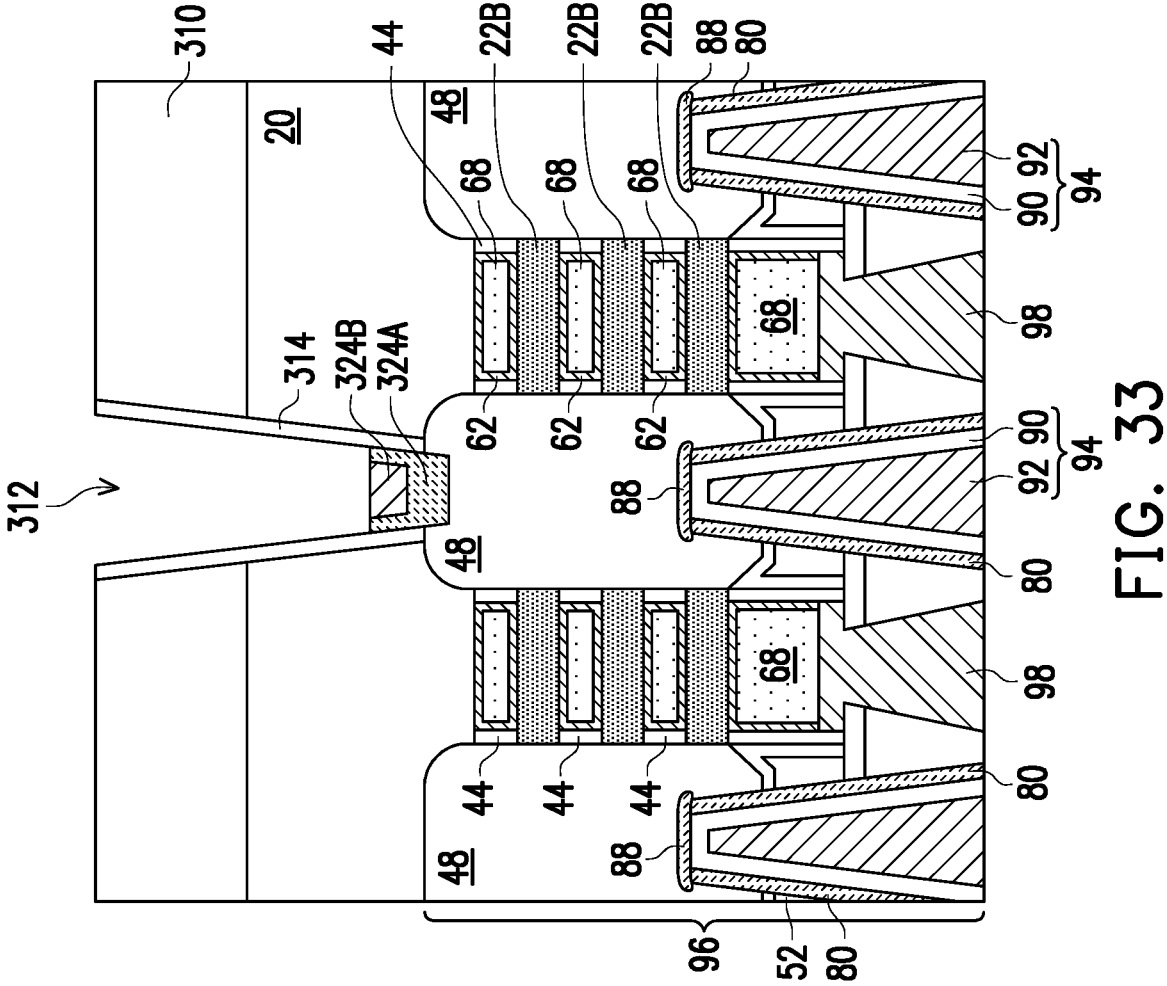
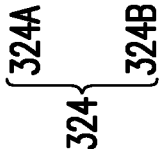
FIG. 33

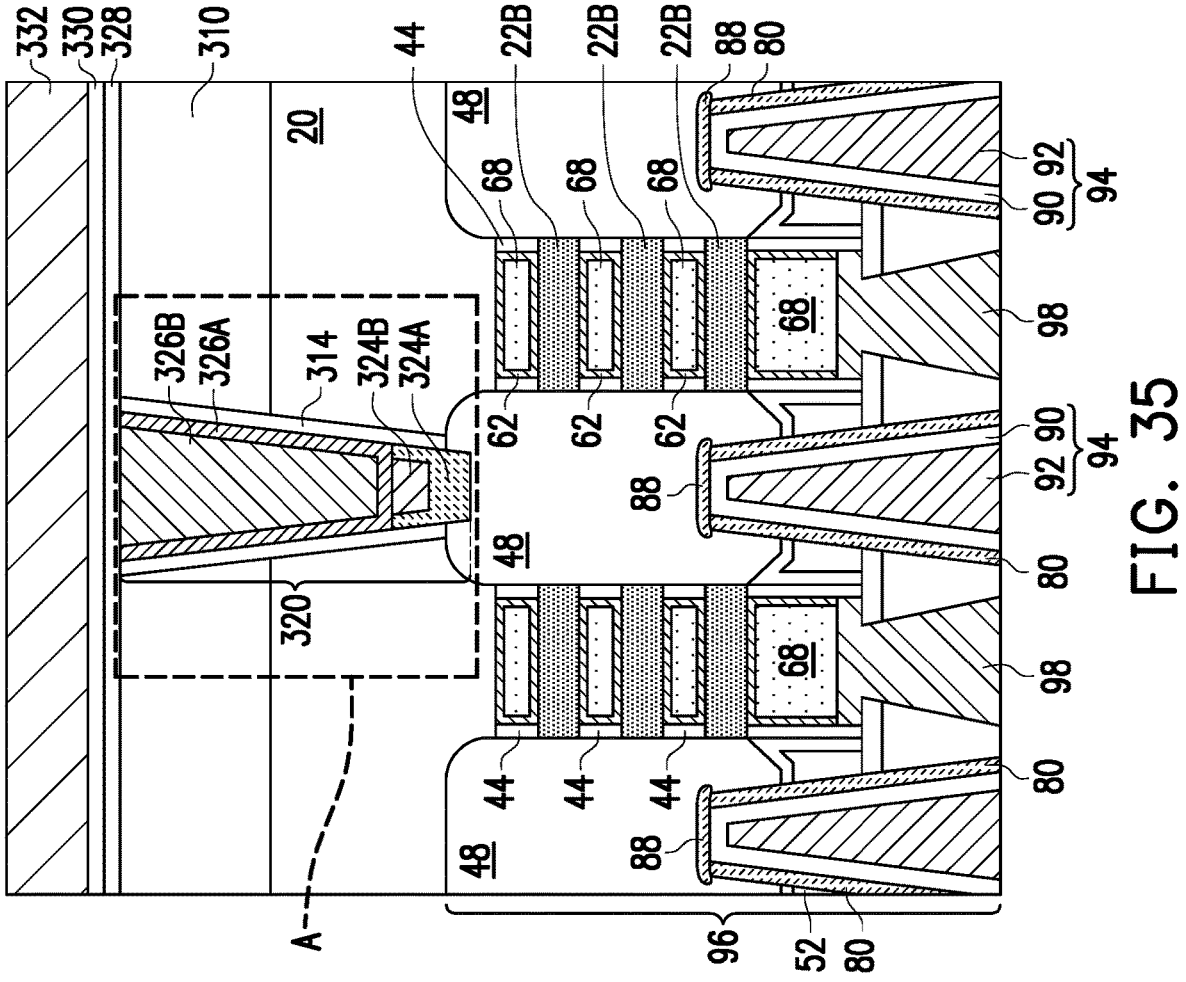
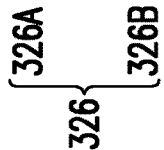
FIG. 35

SEMICONDUCTOR DEVICE AND METHOD OF MANUFACTURING THEREOF

BACKGROUND

With the continuing shrinking of the sizes of integrated circuits, contact resistance is playing an increasingly more important role in the improvement of the performance of the integrated circuits. The contact resistance between source/drain silicide regions and the overlying contact vias is one of the factors in the performance improvement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, and 24B illustrate the cross-sectional views of intermediate stages in the formation of a Gate All-Around (GAA) transistor and contact plugs in accordance with some embodiments.

FIG. 25 illustrates a process flow for forming a GAA transistor and contact plugs in accordance with some embodiments.

FIGS. 26-35 illustrate the cross-sectional views of intermediate stages in the formation of a contact via in accordance with some embodiments.

DETAILED DESCRIPTION

Figure 1:
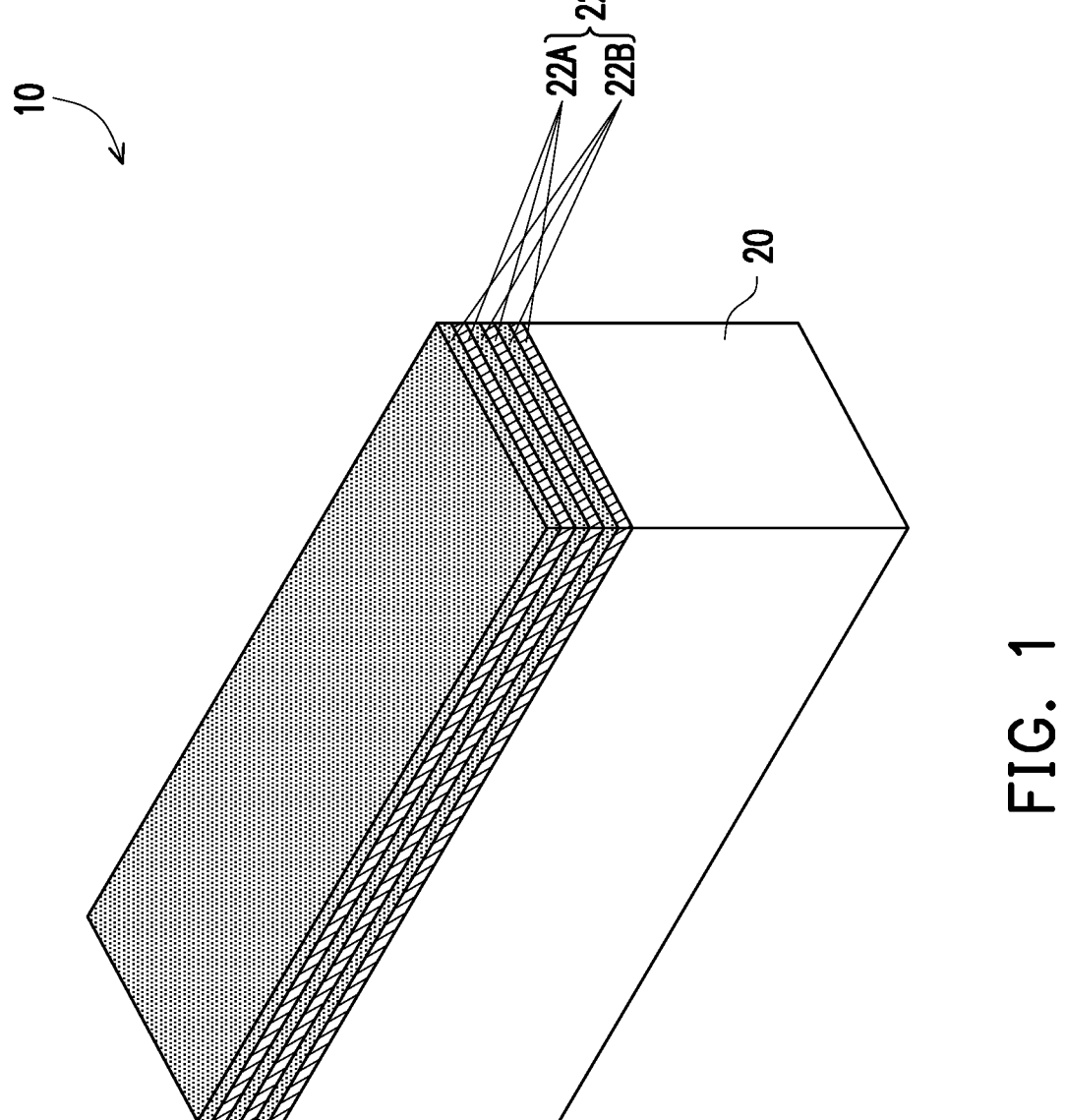

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device, and a method of manufacturing thereof are provided. In accordance with some embodiments of the present disclosure, a source/drain contact via is formed in a via opening. The source/drain contact via comprises a silicide layer, a first metallic portion, a glue layer and a second metallic portion. The first metallic portion is spaced apart from the second metallic portion by the glue layer. The formation of the source/drain contact via, by using a PVD deposition process to form the first metallic portion on the silicide layer, the first metallic portion protects the silicide layer from damage of the CVD deposition process subsequently. The glue layer also solves the problem introduced by CVD deposition process and improves an adhesion between the source/drain contact via and a sidewall of the hard mask layer. By reducing the damage of the silicide layer and improving the reliability of the source/drain contact via, the performance of the resulting transistors is improved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, and 24B illustrate the cross-sectional views of intermediate stages in the formation of a Gate All-Around (GAA) transistor and contact plugs in accordance with some embodiments. The corresponding processes are also reflected schematically in the process flow 200 as shown in FIG. 25.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 25. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
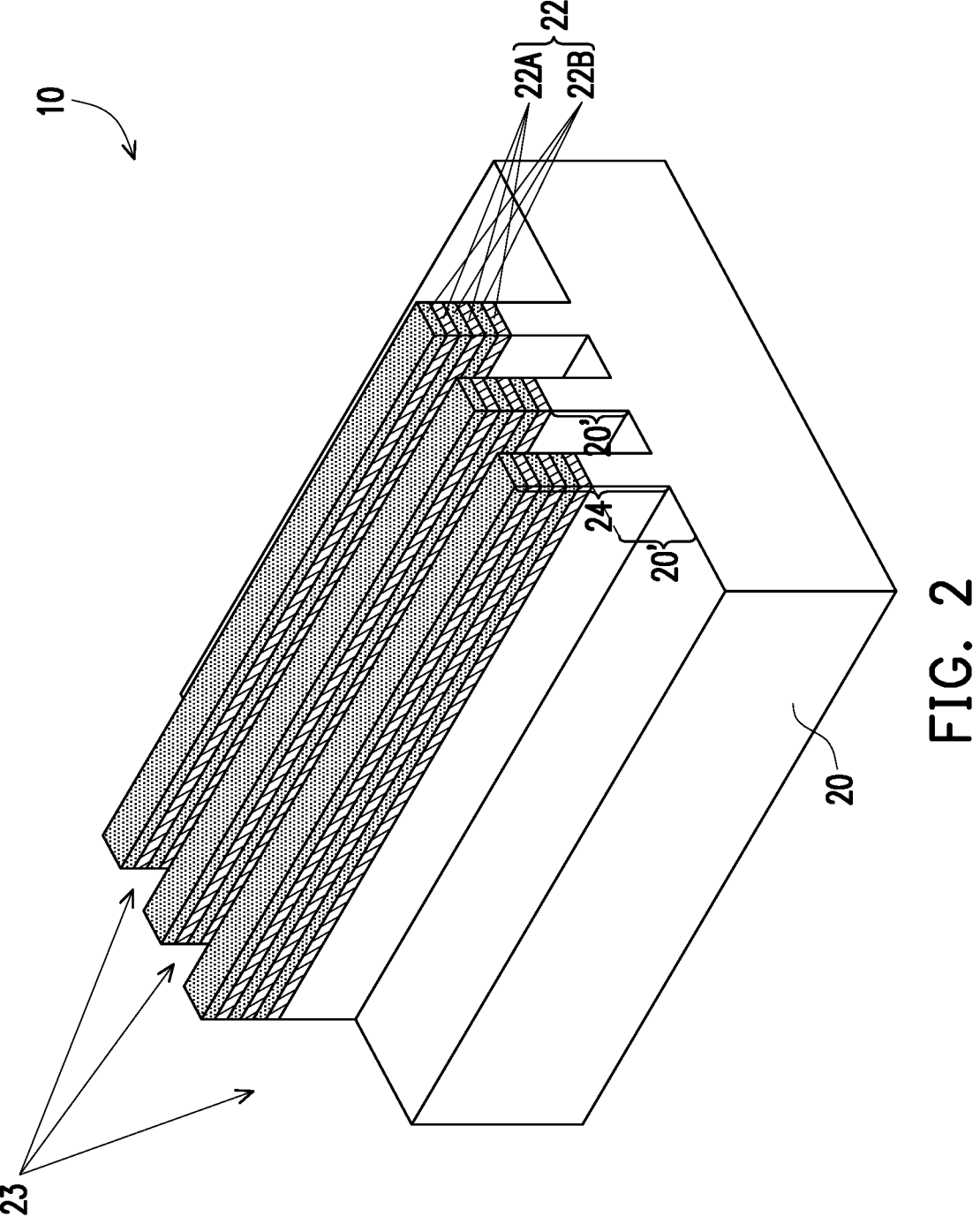

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 25. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
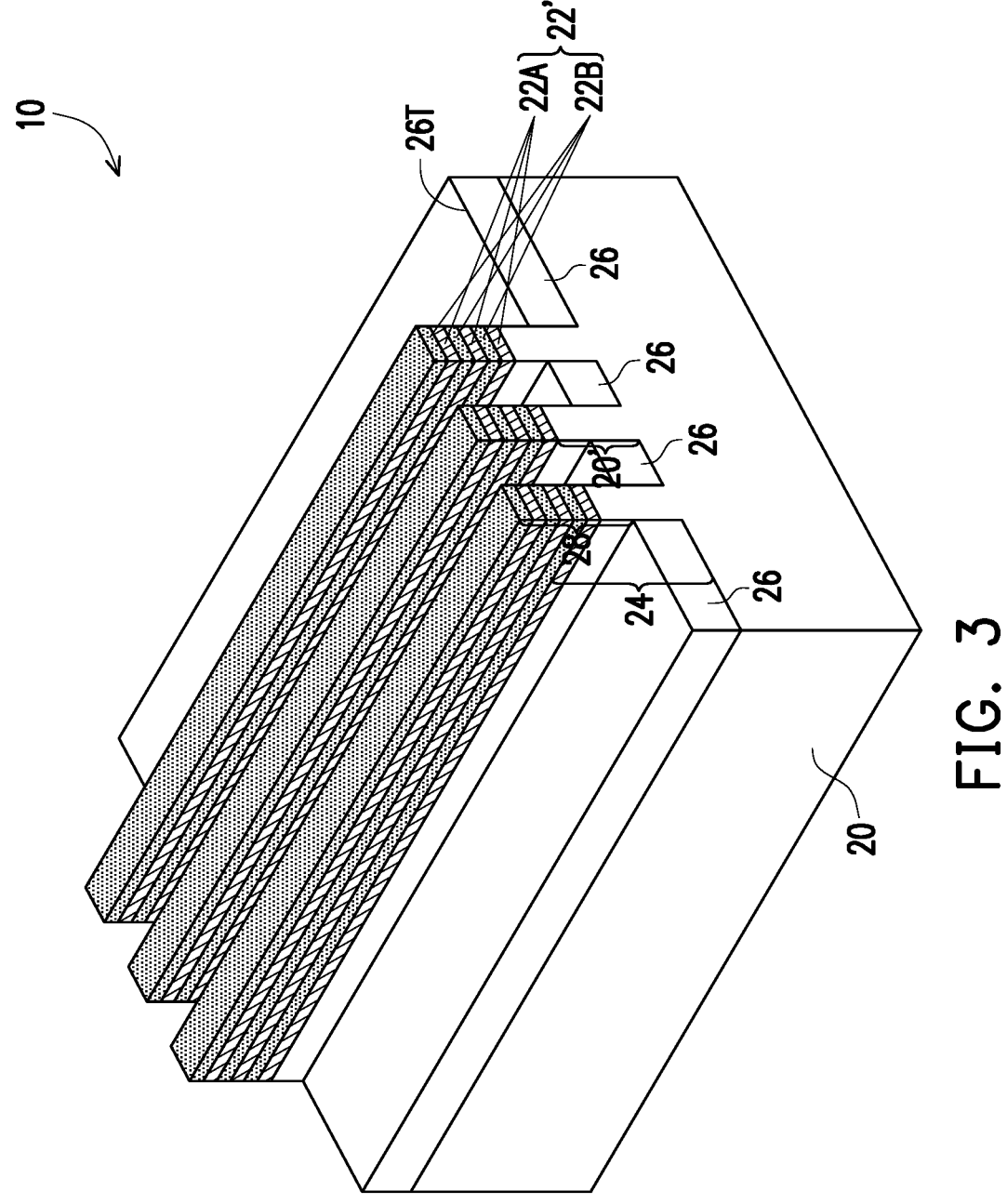

FIG. 3 illustrates the formation of isolation regions 26, which are also referred to as Shallow Trench Isolation (STI) regions throughout the description. The respective process is illustrated as process 206 in the process flow 200 shown in FIG. 25. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and may include the top portions of substrate strips 20'. The recessing of STI regions 26 may be performed through a dry etching process, wherein NF3 and NH3, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
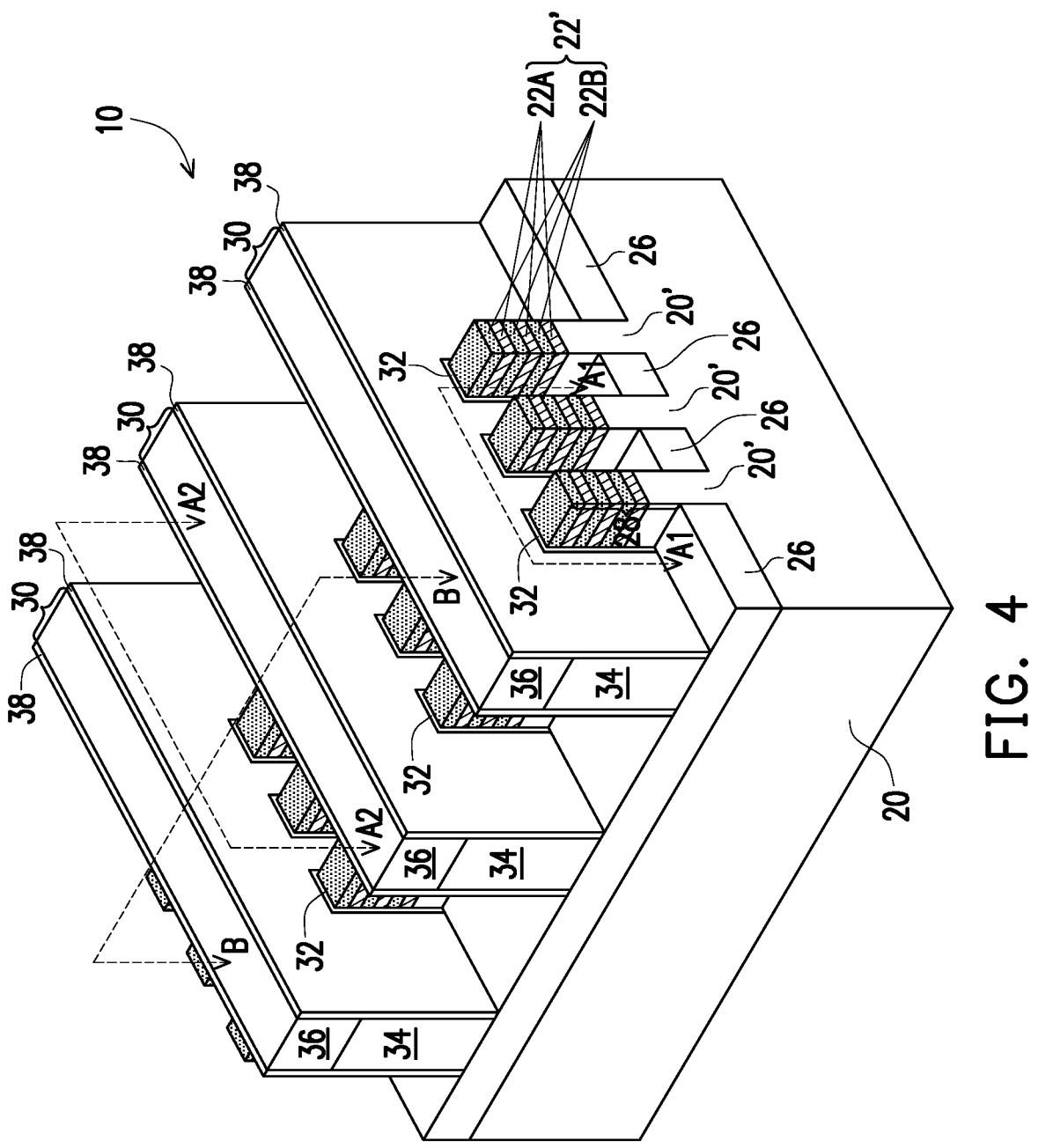

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 25. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a pattering process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5B:
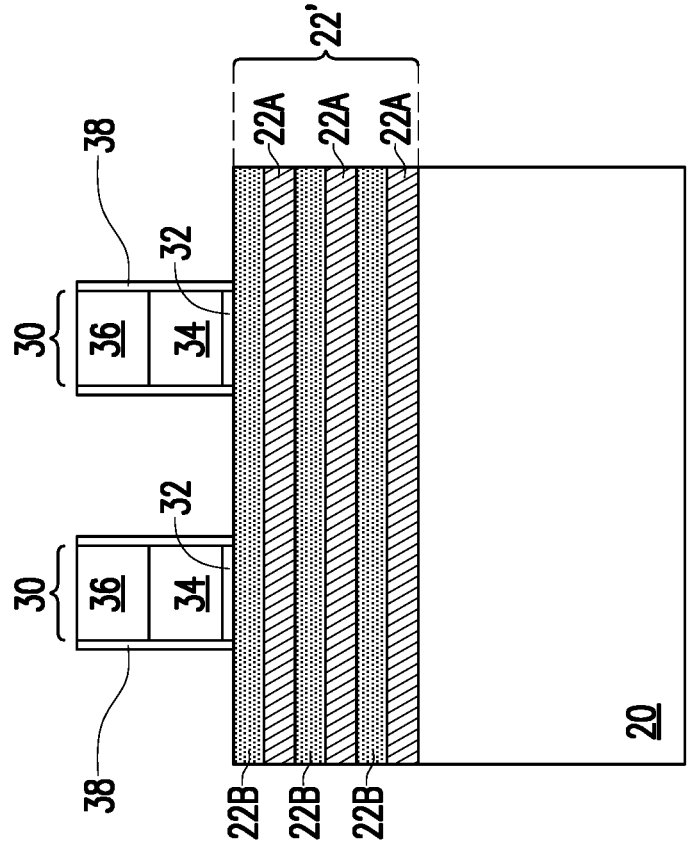
Figure 5A:
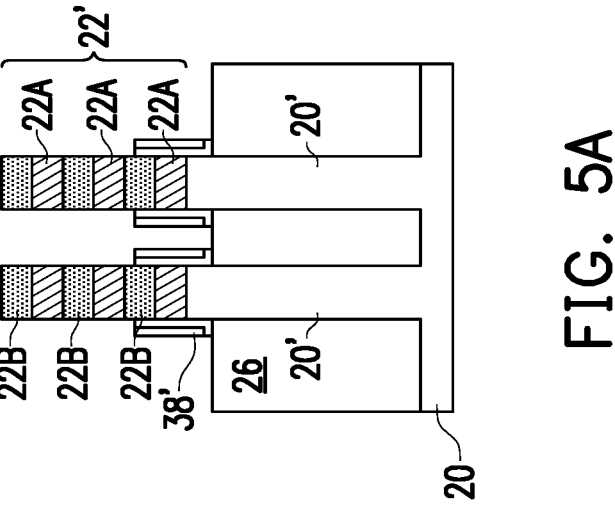

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by gate stacks 30 and gate spacers 38, and is perpendicular to the gate-length direction. Fin spacers 38', which are on the sidewalls of protruding fins 28, are also illustrated. FIG. 5B illustrates the reference cross-section B-B in FIG. 4, which reference cross-section is parallel to the lengthwise directions of protruding fins 28.

Figure 6B:
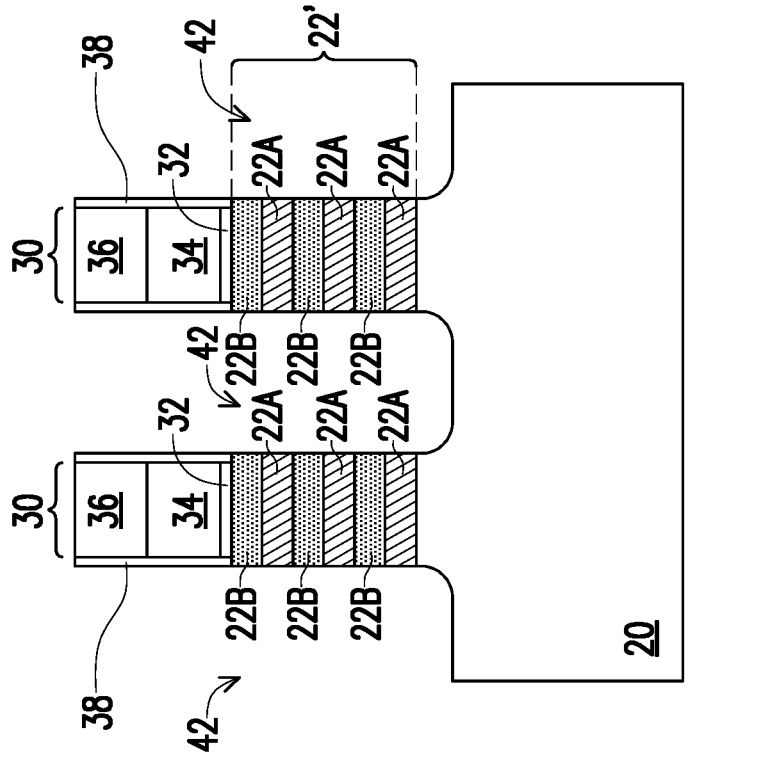
Figure 6A:
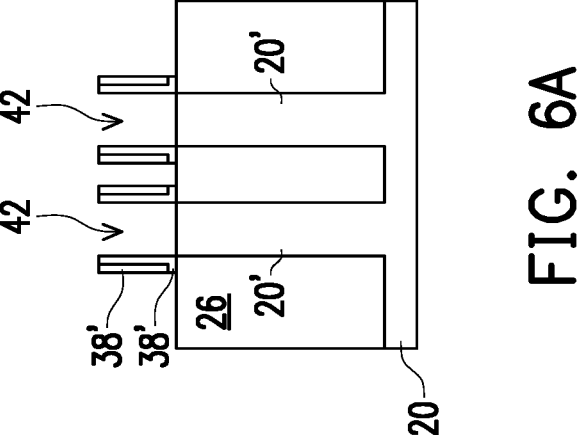

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 25. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7B:
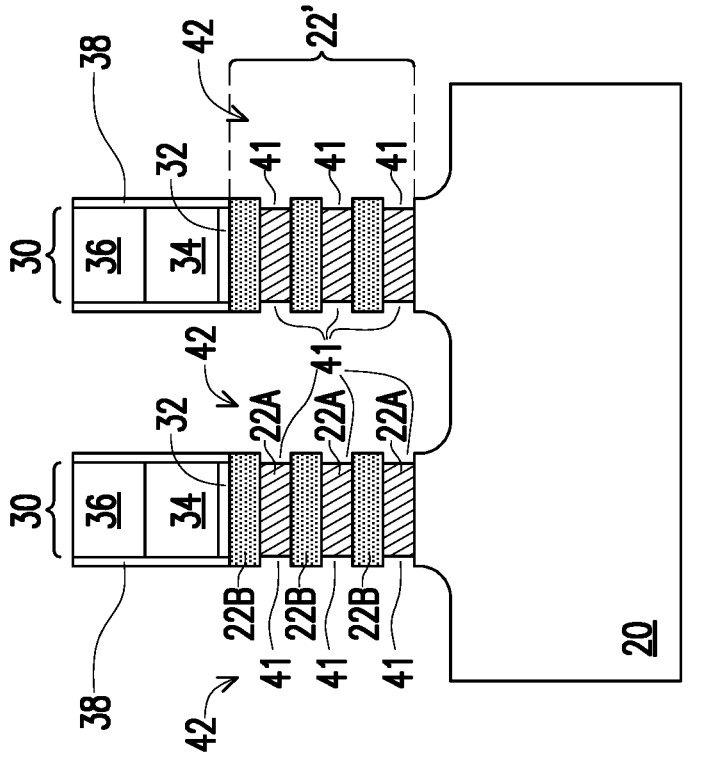
Figure 7A:
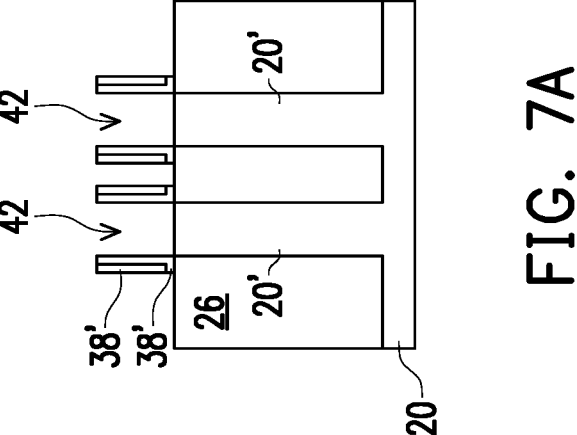

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 25. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, a spin-on process, or the like, and may be performed using any suitable process temperatures (for example, between about 400° C. and about 600° C.). In accordance with alternative embodiments, the lateral recessing of sacrificial semiconductor layers 22A is performed through an isotropic dry etching process or a combination of a dry etching process and a wet etching process.

Figures 8A, 8B:
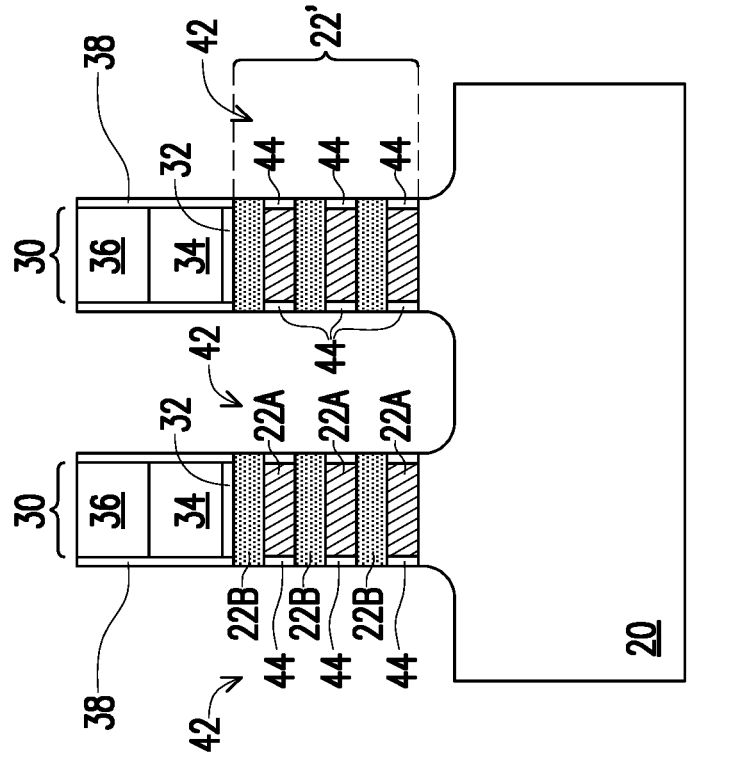

Referring to FIGS. 8A and 8B, inner spacers 44 are formed in the lateral recesses 41. The respective process is illustrated as process 214 in the process flow 200 shown in FIG. 25. The inner spacers 44 act as isolation features between subsequently formed source/drain regions and a gate structure. The formation process may include depositing a conformal dielectric layer and then trimming the conformal dielectric layer. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 44.

Figure 9B:
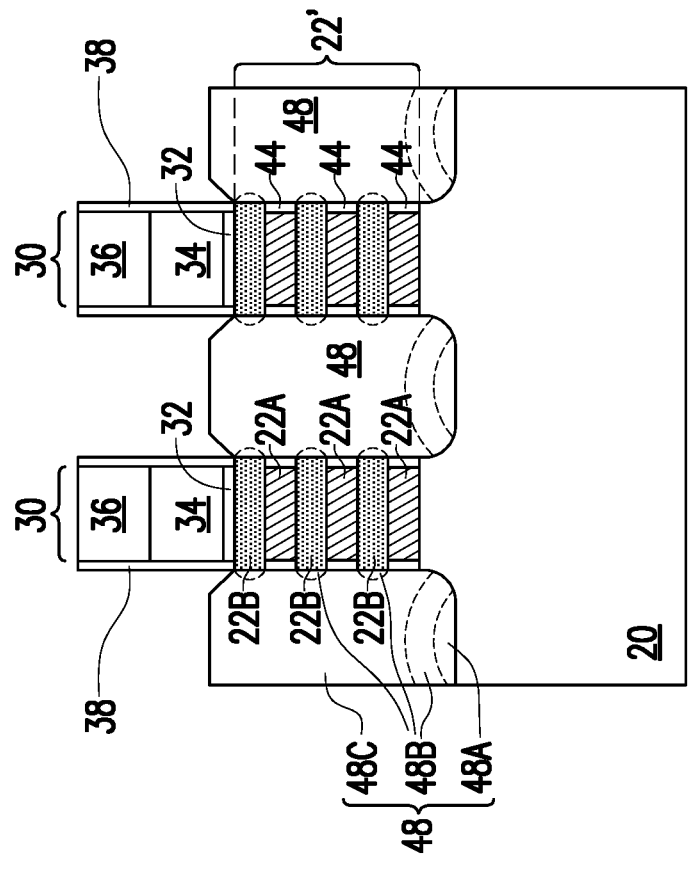

Although the inner sidewalls and the out sidewalls of the inner spacers 44 are schematically illustrated as being straight in FIG. 9B, the inner sidewalls of the inner spacers 44 may be convex, and the outer sidewalls of the inner spacers 44 may be concave or convex. The inner spacers 44 may be used to prevent the damage to subsequently formed source/drain regions, which damage may be caused by subsequent etching processes for forming replacement gate structures.

Figure 9A:
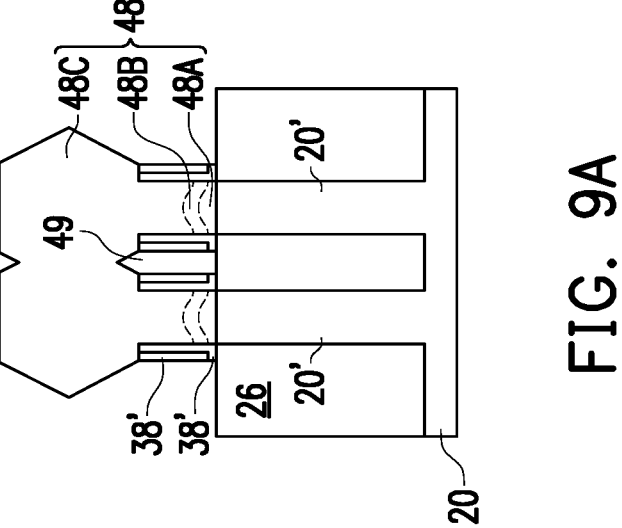

Referring to FIGS. 9A and 9B, epitaxial source/drain regions 48 are formed in recesses 42. The respective process is illustrated as process 216 in the process flow 200 shown in FIG. 25. In accordance with some embodiments, the source/drain regions 48 may exert stress on the nanostructures 22B, which are used as the channels of the corresponding GAA transistors, thereby improving performance. Depending on whether the resulting transistor is a p-type transistor or an n-type transistor, a p-type or an n-type impurity may be in-situ doped with the proceeding of the epitaxy. For example, when the resulting transistor is a p-type Transistor, silicon germanium boron (SiGeB), silicon boron (SiB), or the like may be grown. Conversely, when the resulting transistor is an n-type Transistor, silicon phosphorous (SiP), silicon carbon phosphorous (SiCP), or the like may be grown. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other. Voids (air gaps) 49 (FIG. 9A) may be generated. Epitaxy regions 48 may include a plurality of sub-layers, which are denoted as 48A, 48B, and 48C in accordance with some embodiments. The sub-layers have different concentrations/atomic percentage of silicon, germanium, carbon, and dopant.

After the epitaxy process, epitaxy regions 48 may be further implanted with a p-type or an n-type impurity to form source and drain regions, which are also denoted using reference numeral 48. In accordance with alternative embodiments of the present disclosure, the implantation process is skipped when epitaxy regions 48 are in-situ doped with the p-type or n-type impurity during the epitaxy, and the epitaxy regions 48 are also source/drain regions.

Figure 10B:
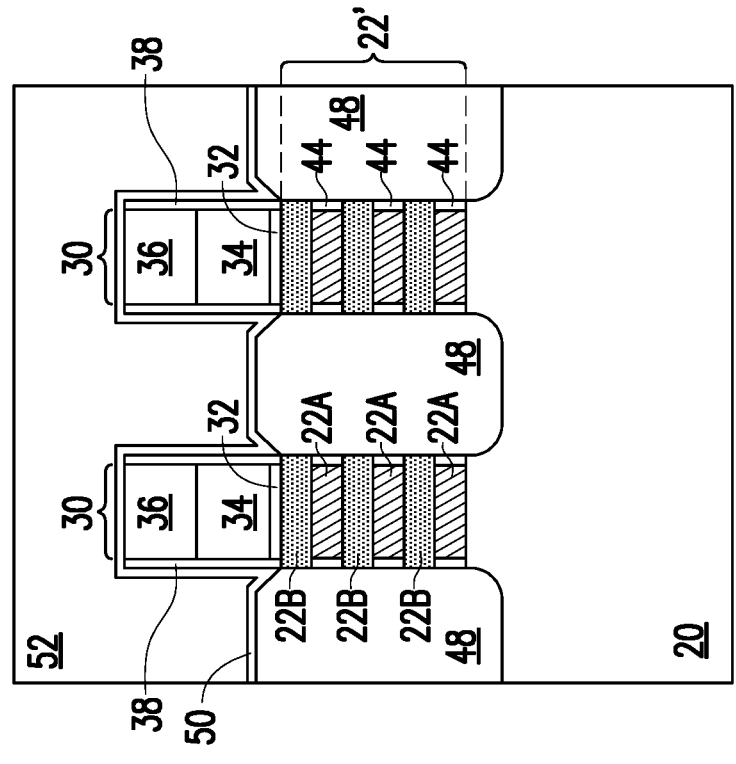
Figure 10A:
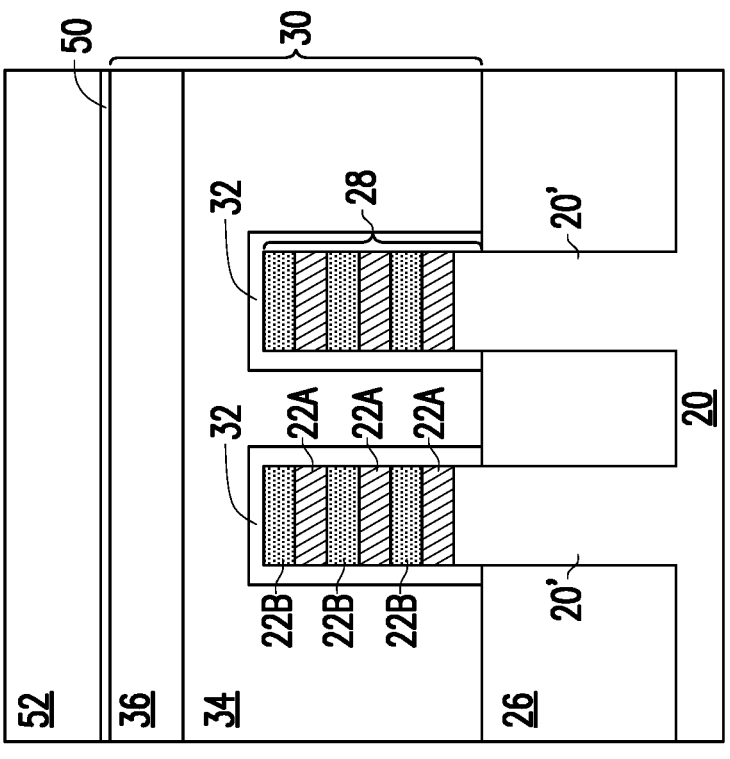

FIGS. 10A and 10B illustrate the cross-sectional views of the structure after the formation of CESL 50 and ILD 52. FIG. 10A illustrates the reference cross-section A2-A2 in FIG. 4, after the formation of CESL 50 and ILD 52. The respective process is illustrated as process 218 in the process flow 200 shown in FIG. 25. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), Undoped Silicate Glass (USG), or the like.

Figure 11B:
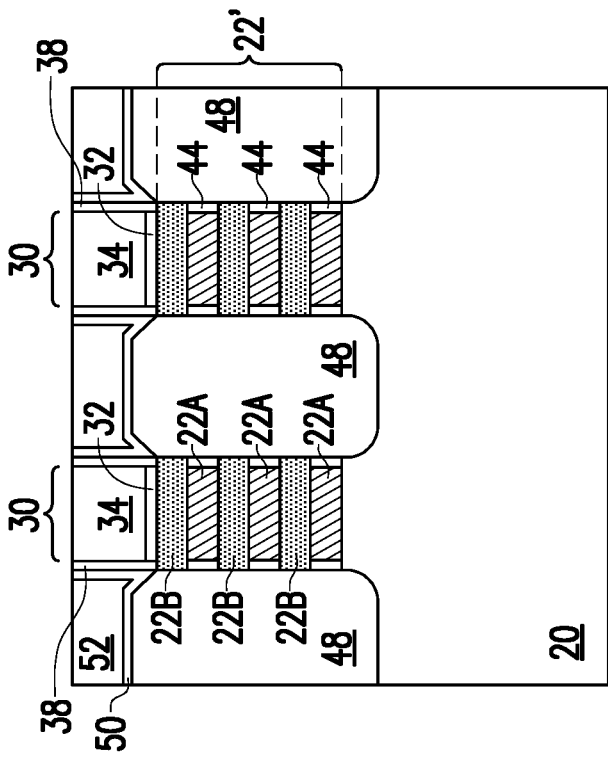
Figure 11A:
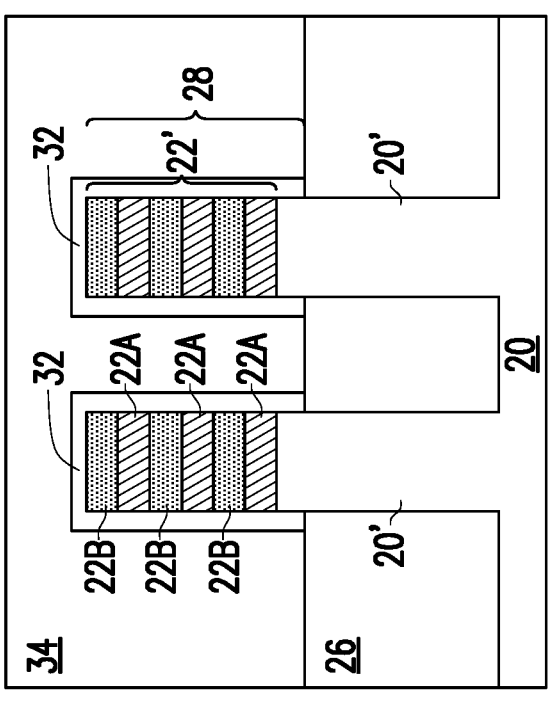

FIGS. 11A and 11B through FIGS. 14A and 14B illustrate the process for forming replacement gate stacks. In FIGS. 11A and 11B, a planarization process such as a CMP process or a mechanical grinding process is performed to level the top surface of ILD 52. The respective process is illustrated as process 220 in the process flow 200 shown in FIG. 25. In accordance with some embodiments, the planarization process may remove hard masks 36 to reveal dummy gate electrodes 34, as shown in FIG. 11A. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level within process variations.

Figure 12B:
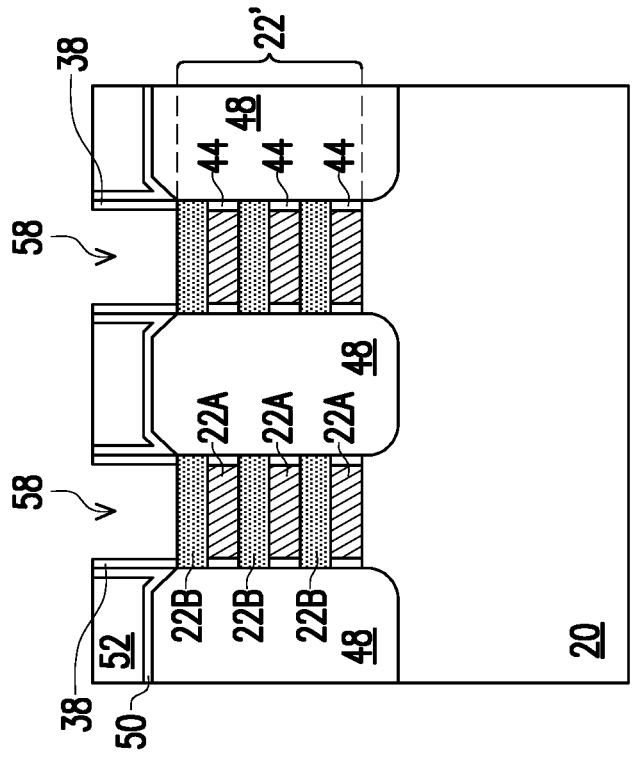
Figure 12A:
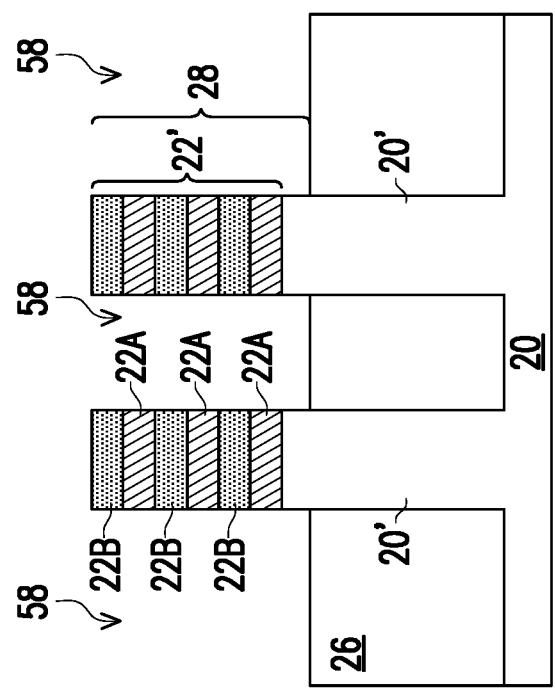

Next, dummy gate electrodes 34 (and hard masks 36, if remaining) are removed in one or more etching processes, so that recesses 58 are formed, as shown in FIGS. 12A and 12B. The respective process is illustrated as process 222 in the process flow 200 shown in FIG. 25. The portions of the dummy gate dielectrics 32 in recesses 58 are also removed. In accordance with some embodiments, dummy gate electrodes 34 and dummy gate dielectrics 32 are removed through an anisotropic dry etch process. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The portions of the multilayer stacks 22' are between neighboring pairs of the epitaxial source/drain regions 48.

Figure 13B:
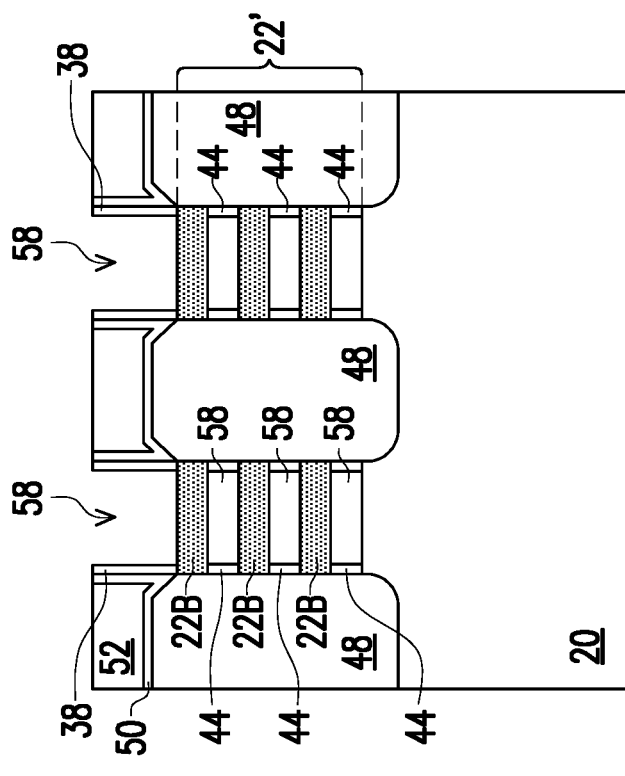
Figure 13A:
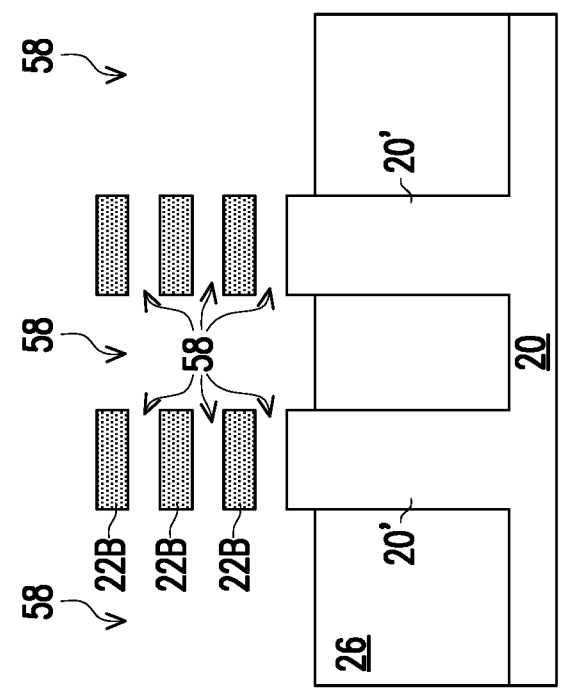

Sacrificial layers 22A are then removed to extend recesses 58 between nanostructures 22B, and the resulting structure is shown in FIGS. 13A and 13B. The respective process is illustrated as process 224 in the process flow 200 shown in FIG. 25. Sacrificial layers 22A may be removed by performing an isotropic etching process such as a wet etching process using etchants which are selective to the materials of sacrificial layers 22A, while nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or SiC, tetra methyl ammonium hydroxide (TMAH), ammonium hydroxide (NH4OH), or the like may be used to remove sacrificial layers 22A.

Figures 14A, 14B:
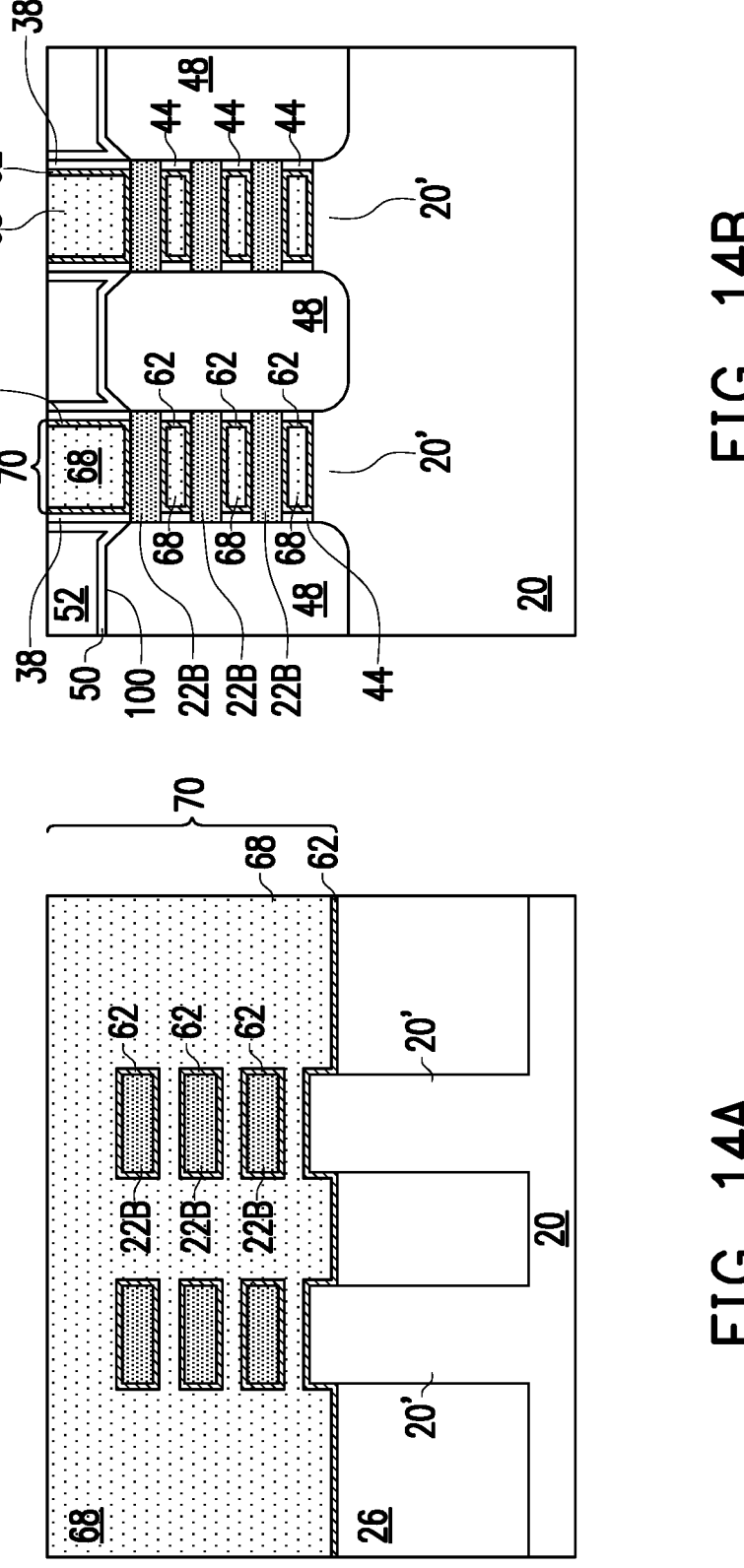

Referring to FIGS. 14A and 14B, gate dielectrics 62 are formed. The respective process is illustrated as process 226 in the process flow 200 shown in FIG. 25. In accordance with some embodiments, each of gate dielectric 62 includes an interfacial layer and a high-k dielectric layer on the interfacial layer. The interfacial layer may be formed of or comprises silicon oxide, which may be deposited through a conformal deposition process such as ALD or CVD. In accordance with some embodiments, the high-k dielectric layers comprise one or more dielectric layers. For example, the high-k dielectric layer(s) may include a metal oxide or a silicate of hafnium, aluminum, zirconium, lanthanum, manganese, barium, titanium, lead, and combinations thereof.

Gate electrodes 68 are then formed. In the formation, conductive layers are first formed on the high-k dielectric layer and filling the remaining portions of recesses 58. The respective process is illustrated as process 228 in the process flow 200 shown in FIG. 25. Gate electrodes 68 may include a metal-containing material such as TiN, TaN, TiAl, TiAlC, cobalt, ruthenium, aluminum, tungsten, combinations thereof, and/or multilayers thereof. For example, although in FIGS. 14A and 14B, a single layer is illustrated to represent a gate electrode 68, gate electrodes 68 may comprise any number of layers including any number of capping/adhesion layers, work function layers, and possibly a filling material. Gate dielectrics 62 and gate electrodes 68 also fill the spaces between adjacent ones of nanostructures 22B, and fill the spaces between the bottom ones of nanostructures 22B and the underlying substrate strips 20'. After the filling of recesses 58, a planarization process such as a CMP process or a mechanical grinding process is performed to remove the excess portions of the gate dielectrics and the material of gate electrodes 68, which excess portions are over the top surface of ILD 52. Gate electrodes 68 and gate dielectrics 62 are collectively referred to as gate stacks 70 of the resulting nano-FETs.

Figures 15A, 15B:
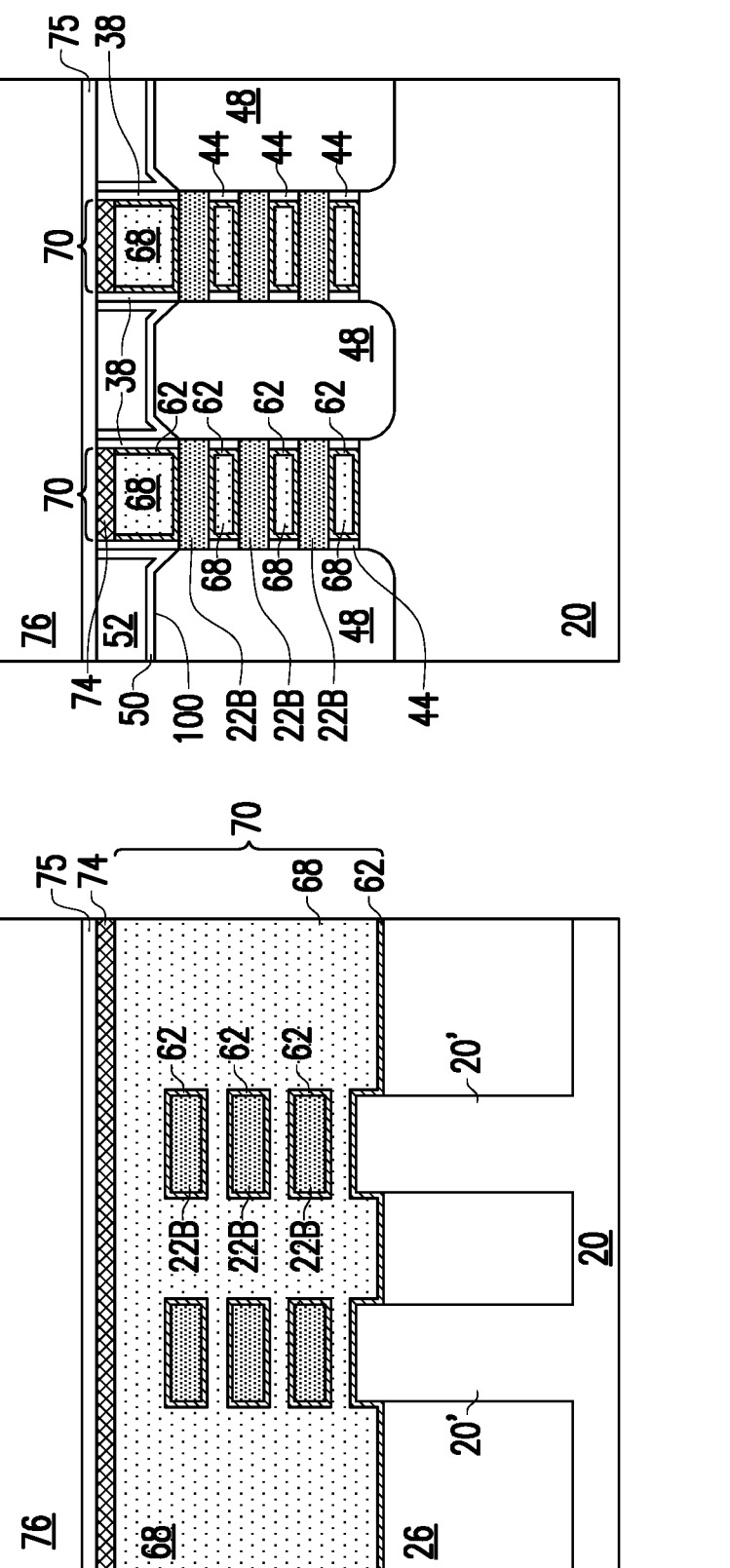

In the processes shown in FIGS. 15A and 15B, gate stacks 70 are recessed, so that recesses are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 230 in the process flow 200 shown in FIG. 25.

As further illustrated by FIGS. 15A and 15B, etch stop layer 75 and ILD 76 are deposited over ILD 52 and over gate masks 74. The respective process is illustrated as process 232 in the process flow 200 shown in FIG. 25. In accordance with some embodiments, etch stop layer 75 is formed through ALD, CVD, PECVD, or the like, and may be formed of silicon nitride, silicon carbide, silicon oxynitride, aluminum oxide, aluminum nitride, or the like, or multilayers thereof. ILD 76 is formed through FCVD, CVD, PECVD, or the like. ILD 76 is formed of a dielectric material, which may be selected from silicon oxide, PSG, BSG, BPSG, USG, or the like.

Figures 16A, 16B:
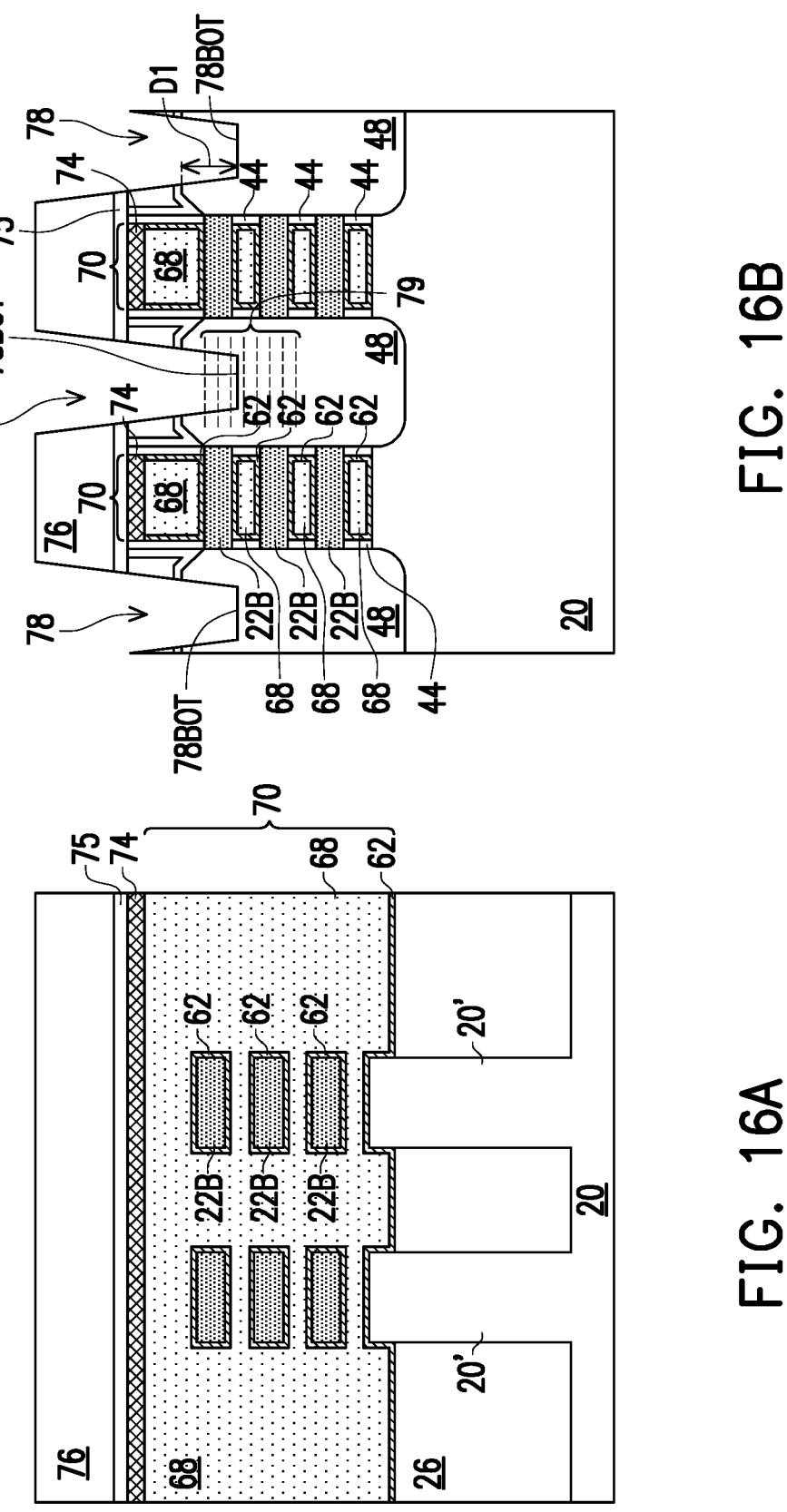

FIGS. 16A, 16B, 17A, 17B, 18A, 18B, 19A, 19B, 20A, 20B, 21A, 21B, 22A, 22B, 23A and 23B illustrate the formation of source/drain silicide regions and source/drain contact plugs in accordance with some embodiments. Referring to FIGS. 16A and 16B, ILD 76, etch stop layer 75, ILD 52, and CESL 50 are etched to form trenches 78 having bottoms 78BOT. The respective process is illustrated as process 234 in the process flow 200 shown in FIG. 25.

In accordance with some embodiments, ILD 76, etch stop layer 75, and ILD 52 may be etched using a same process gas or different processes. Next, CESL 50 is etched to reveal the underlying source/drain regions 48. The etching process may be a dry etching process or a wet etching process, and the etching chemical depends on the material of CESL 50, ILD 76, etch stop layer 75, and ILD 52. After CESL 50 is etched-through, an additional dry etching process is performed to etch source/drain regions 48, so that trenches 78 extend into source/drain regions 48. The etching gas may include $CxHyFz$, HBr, $Cl_2$, and/or the like. Also, the etching gas may be different from the etching gas of CESL 50 (if dry etching is adopted). The process conditions for etching source/drain regions 48 may be different from the process conditions for etching CESL 50. For example, the bias power for the dry etching of source/drain regions 48 may be higher than the bias power for the dry etching of CESL 50. In accordance with some embodiments, trenches 78 extend into source/drain regions 48 by depth D1, which may be greater than about 5 nm, and may be in the range between about 5 nm and about 10 nm.

Referring again to FIG. 16B, in accordance with some embodiments of the present disclosure, the bottoms 78BOT of trenches 78 are lower than the topmost nanostructure 22B among the plurality of nanostructure 22B. The bottoms 78BOT of trenches 78 may also be at various levels relative to the levels of the plurality of nanostructure 22B. For example, a plurality of dashed lines 79 are drawn to show possible positions of the bottoms 78BOT of trenches 78. For example, the bottoms 78BOT may be level with or lower than the top or the bottom of the topmost nanostructure 22B, or may be level with or lower than the top or bottom of the second or the third nanostructure 22B counting from top. Lowering the bottom trenches 78, or example, to be level with or lower than the top or even the bottom of the topmost nanostructure 22B may result in the improvement in the device performance. Forming trenches 78 extending deep into source/drain regions 48, however, may result in problems in the subsequent formation of silicide regions. Accordingly, processes are adjusted to solve these problems, as discussed in subsequent paragraphs.

Figure 17B:
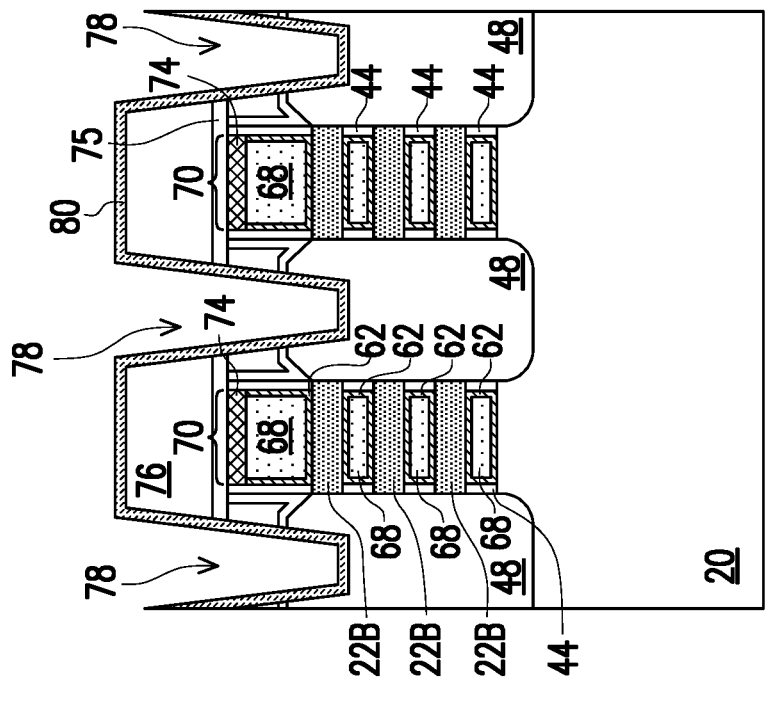
Figure 17A:
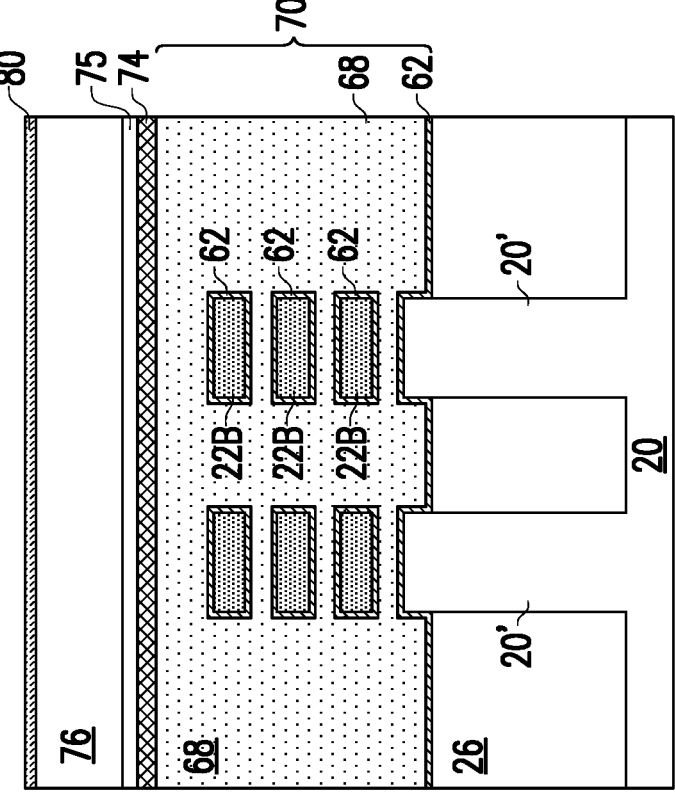
Figures 18A, 18B:
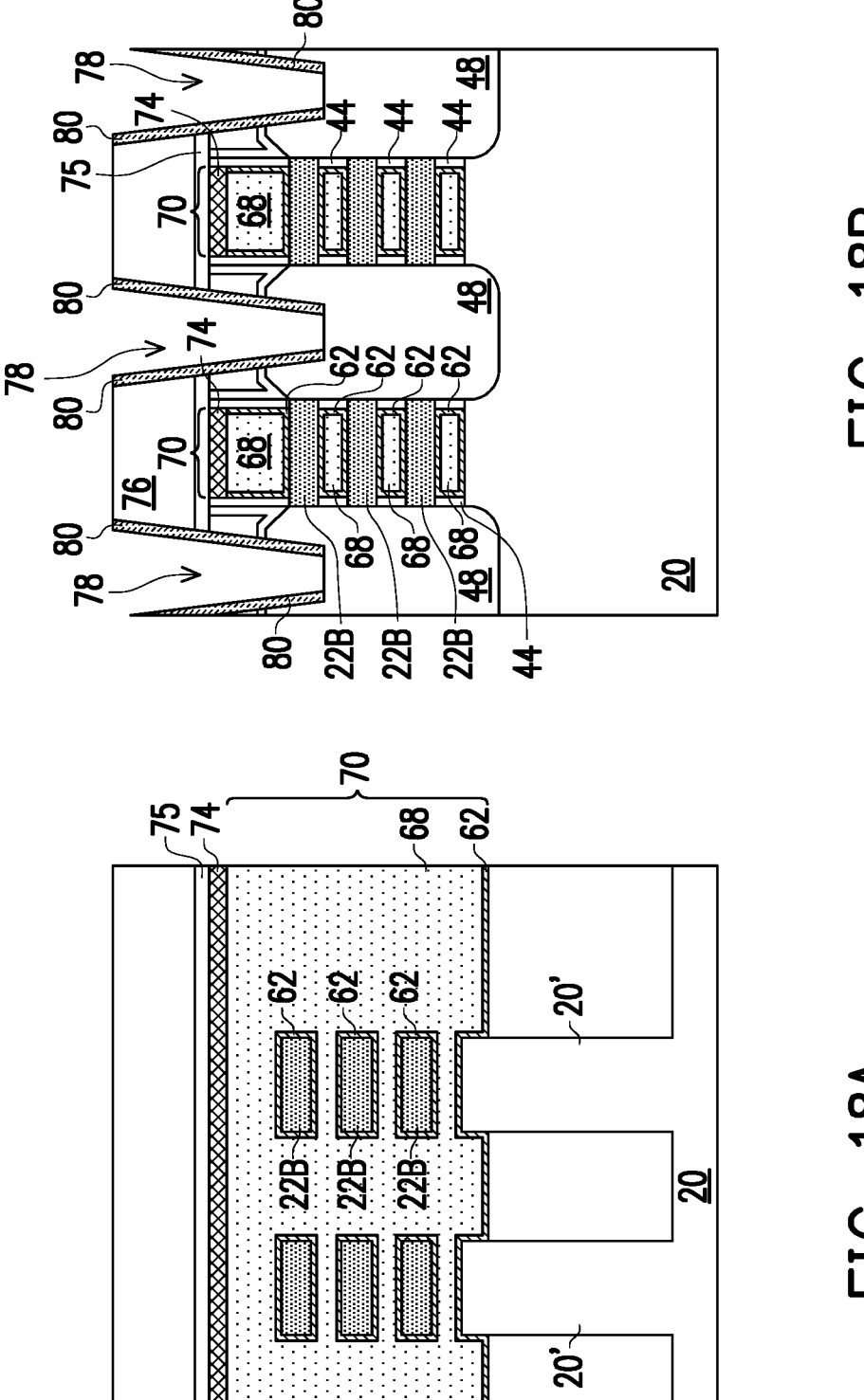

Referring to FIGS. 17A and 17B, dielectric layer 80 is formed. In accordance with some embodiments, dielectric layer 80 is formed of a dielectric material such as silicon nitride, silicon oxynitride, silicon oxide, silicon oxy-carbo-nitride, or the like. Next, an anisotropic etching process is performed to remove the horizontal portions of dielectric layer 80, leaving the vertical portions of dielectric layer 80 as an isolation layer, which forms a ring. The resulting structures are illustrated in FIGS. 18A and 18B. The respective process is illustrated as process 236 in the process flow 200 shown in FIG. 25.

Figures 19A, 19B:
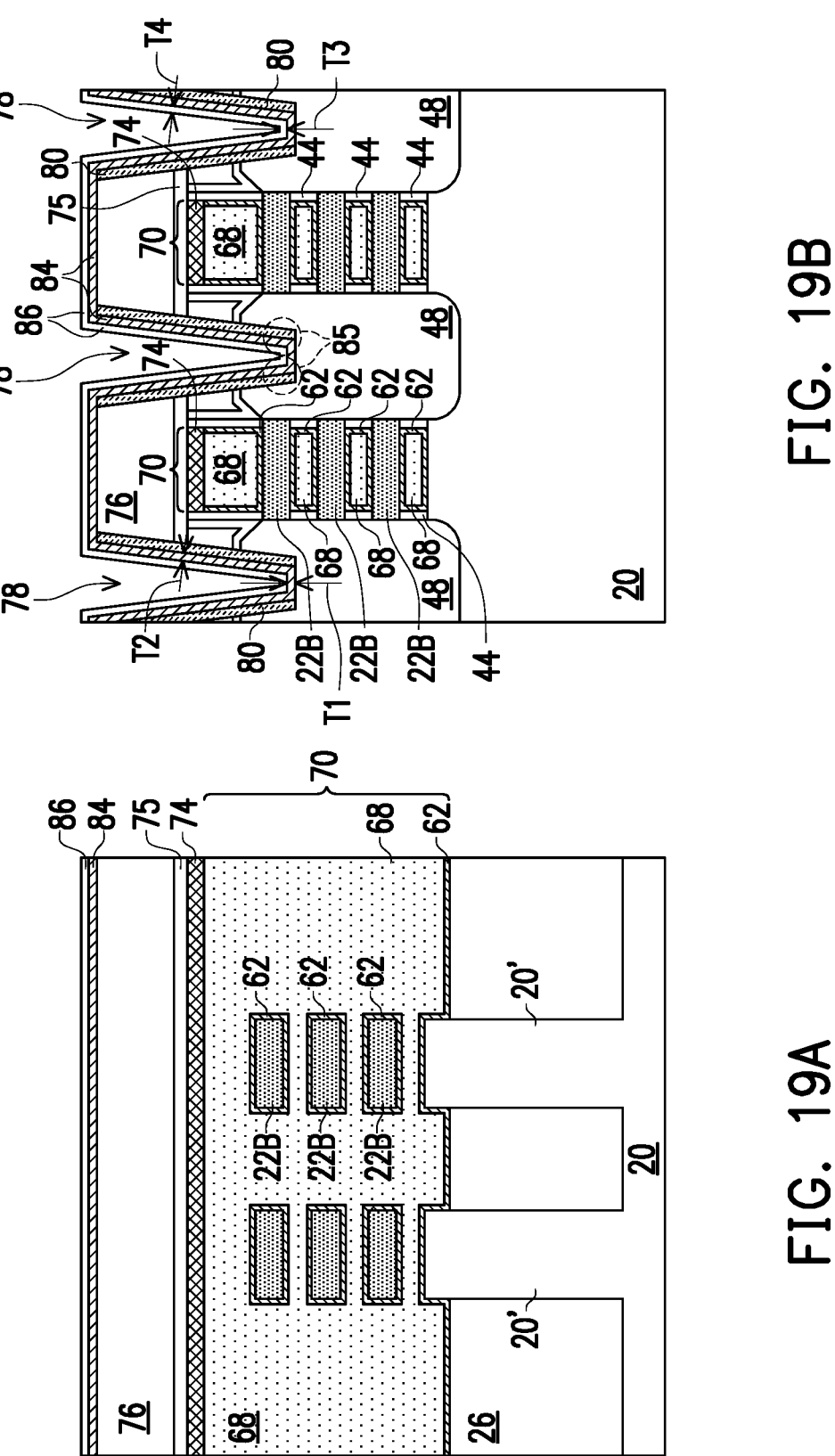

Referring to FIGS. 19A and 19B, metal layer 84 (such as a titanium layer or a cobalt layer, or the like) is deposited. The respective process is illustrated as process 238 in the process flow 200 shown in FIG. 25. The metal layer 84 is formed using CVD, PVD, PECVD, or the like. As a result of the conformal deposition process, different portions (such as horizontal portions, vertical portions, and corner portions) of metal layer 84 have a uniform thickness or a substantially uniform thickness. The bottom thickness T1 and sidewall thickness T2 of metal layer 84 are equal to or close to each other, for example, with the ratio |T1−T2|/T2 being smaller than about 20% or smaller than about 10%. In accordance with some embodiments, thicknesses T1 and T2 of metal layer 84 may be in the range between about 1 nm and bout 4 nm.

FIGS. 19A and 19B further illustrate the deposition of capping layer 86, which may be a metal nitride layer such as a titanium nitride layer. The respective process is also illustrated as process 238 in the process flow 200 shown in FIG. 25. In accordance with some embodiments, capping layer 86 is formed using CVD, PVD, PECVD, or the like. The bottom thickness T3 and sidewall thickness T4 of capping layer 86 may be equal to or close to each other, for example, with the ratio |T3−T4|/T4 being smaller than about 20% or about 10%. Alternatively, bottom thickness T3 is greater than sidewall thickness T4. For example, ratio (T3−T4)/T4 may be greater than about 0.5 or greater than about 1.0, and may be in the range between about 1.0 and about 5.0.

Figure 20B:
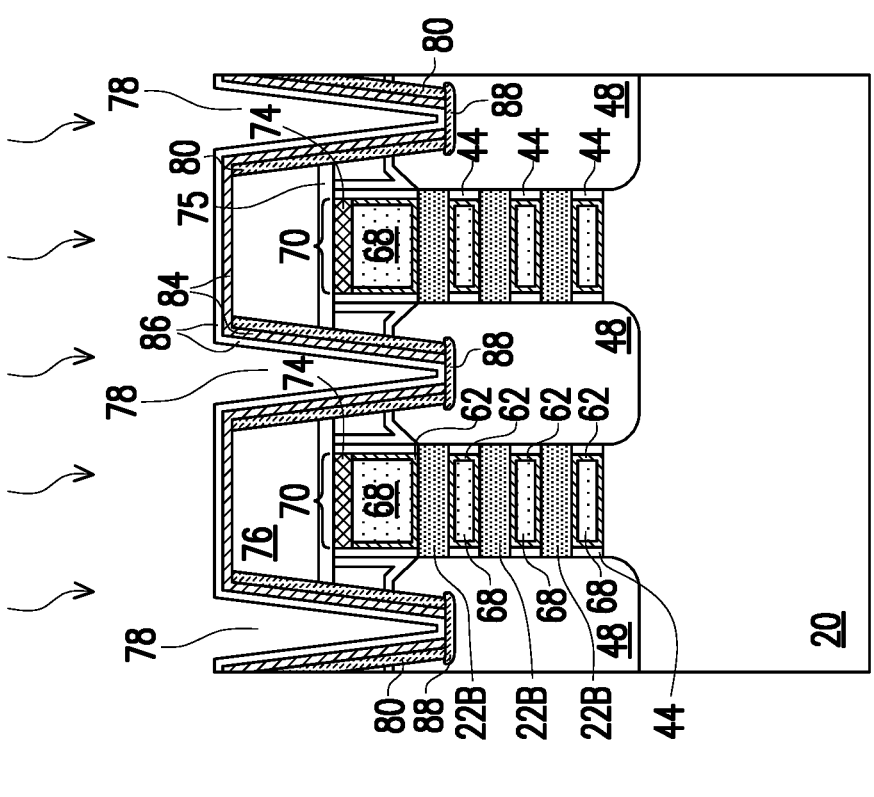
Figure 20A:
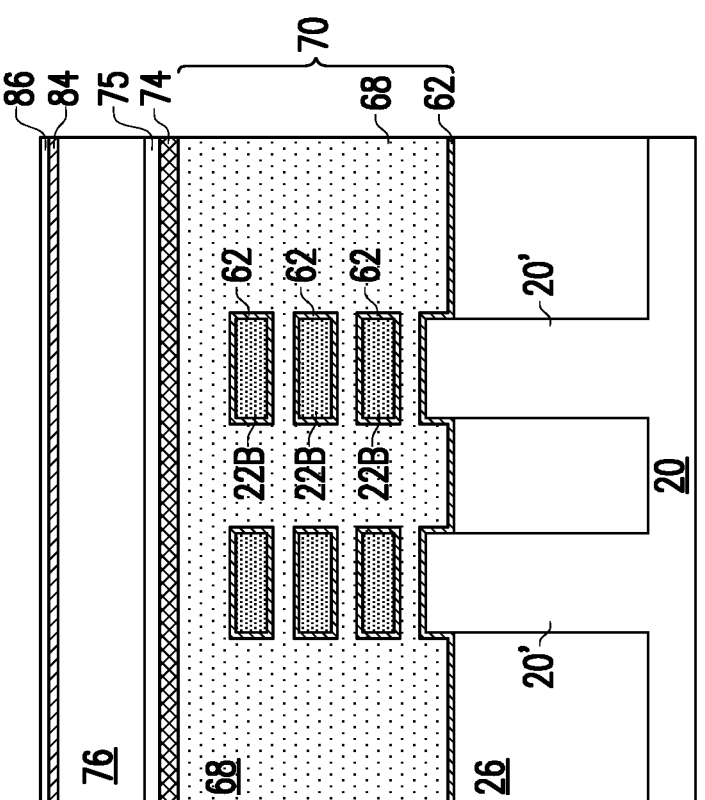

Referring to FIGS. 20A and 20B, an annealing process is performed. In accordance with some embodiments, the annealing process is performed at a temperature in the range between about 400° C. and about 600° C. The deposition of metal layer 84, capping layer 86, and the annealing process may be in-situ performed in a same environment without vacuum break in between. Due to the elevated temperature for depositing metal layer 84, and further due to the annealing process, the bottom portions of metal layer 84 react with source/drain regions 48 to form silicide regions 88. The respective process is illustrated as process 240 in the process flow 200 shown in FIG. 25. The sidewall portions of metal layer 84 remain after the annealing process. Silicide regions 88 may be formed of silicide and/or germanide.

In subsequent processes, capping layer 86 may be removed in an etching process. In accordance with some embodiments, an additional etching process is performed to remove the remaining portions of metal layer 84. In accordance with alternative embodiments, the remaining metal layer 84 is not etched, and is left in the final contact plugs.

Figures 21A, 21B:
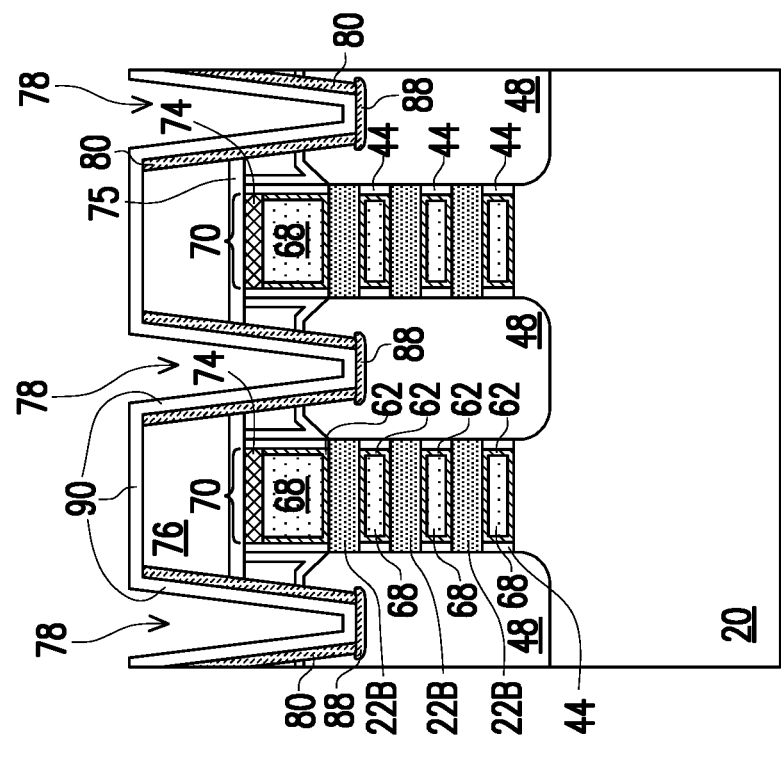
Figure 22B:
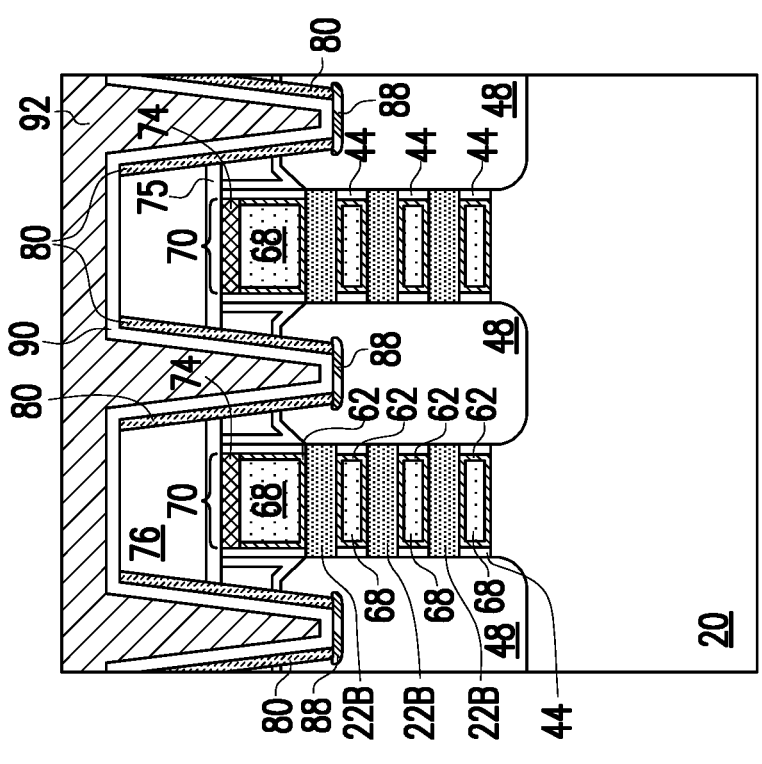
Figure 22A:

FIGS. 21A and 21B illustrate the deposition of another capping layer 90, which may comprise a metal nitride such as titanium nitride. The respective process is illustrated as process 242 in the process flow 200 shown in FIG. 25. Next, as shown in FIGS. 22A and 22B, a filling metal 92 such as cobalt, tungsten, aluminum, or the like, is deposited. The respective process is illustrated as process 244 in the process flow 200 shown in FIG. 25. A planarization process such as a CMP process or a mechanical grinding process may be performed to remove excess material. The respective process is illustrated as process 246 in the process flow 200 shown in FIG. 25. The resulting structure is shown in FIGS. 23A and 23B. The remaining conductive layers including 90 and 92 (and 84 if not removed) are collectively referred to as source/drain contact plugs 94.

Referring back to FIG. 19B, by using the conformal deposition process to deposit metal layer 84, metal layer 84 has a uniform thickness. Specifically, the thickness of metal layer 84 at bottom corner regions such as regions 85 have the same thicknesses as the thickness of other portions such as vertical and horizontal portions. The sizes/thickness of the resulting silicide regions 88 is related to the thickness of metal layer 84. Accordingly, the portions of silicide regions 88 (FIG. 20B) close to the bottom corner regions 85 also have increased thicknesses.

FIGS. 24A and 24B illustrate the formation of gate contact plugs 98. The formation process includes etching ILD 76, etch stop layer 75, and gate masks 74 to reveal gate electrodes 68, filling a conductive material(s) such as Ti, TiN, W, Co, or the like, and performing a planarization process. GAA transistor 96 is thus formed.

Figure 36:
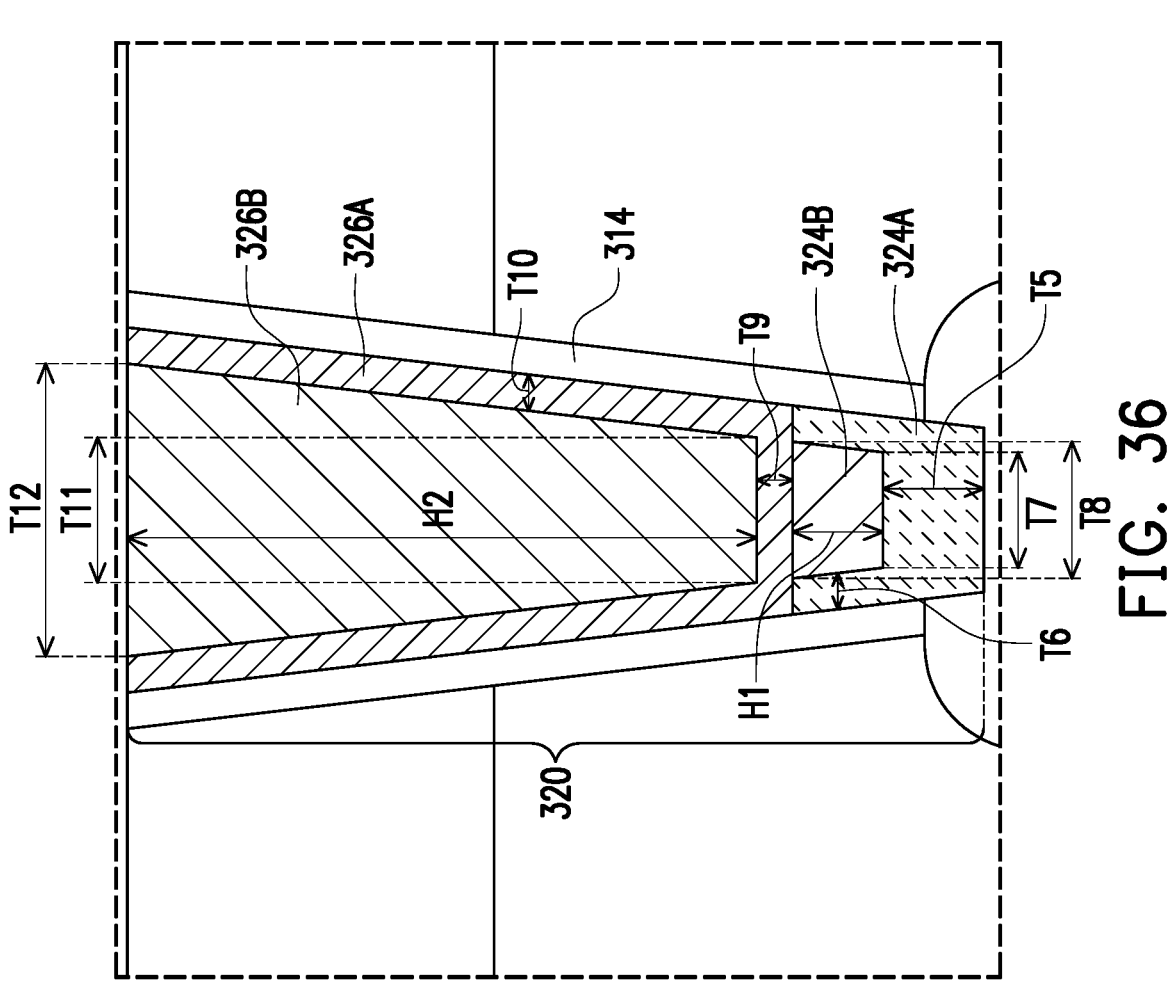
FIG. 36 illustrates a partial enlargement view of a portion A of FIG. 35.

FIGS. 26-35 illustrate the cross-sectional views of intermediate stages in the formation of a contact via in accordance with some embodiments. FIG. 36 illustrates a partial enlargement view of a portion A of FIG. 35.

Figure 26:
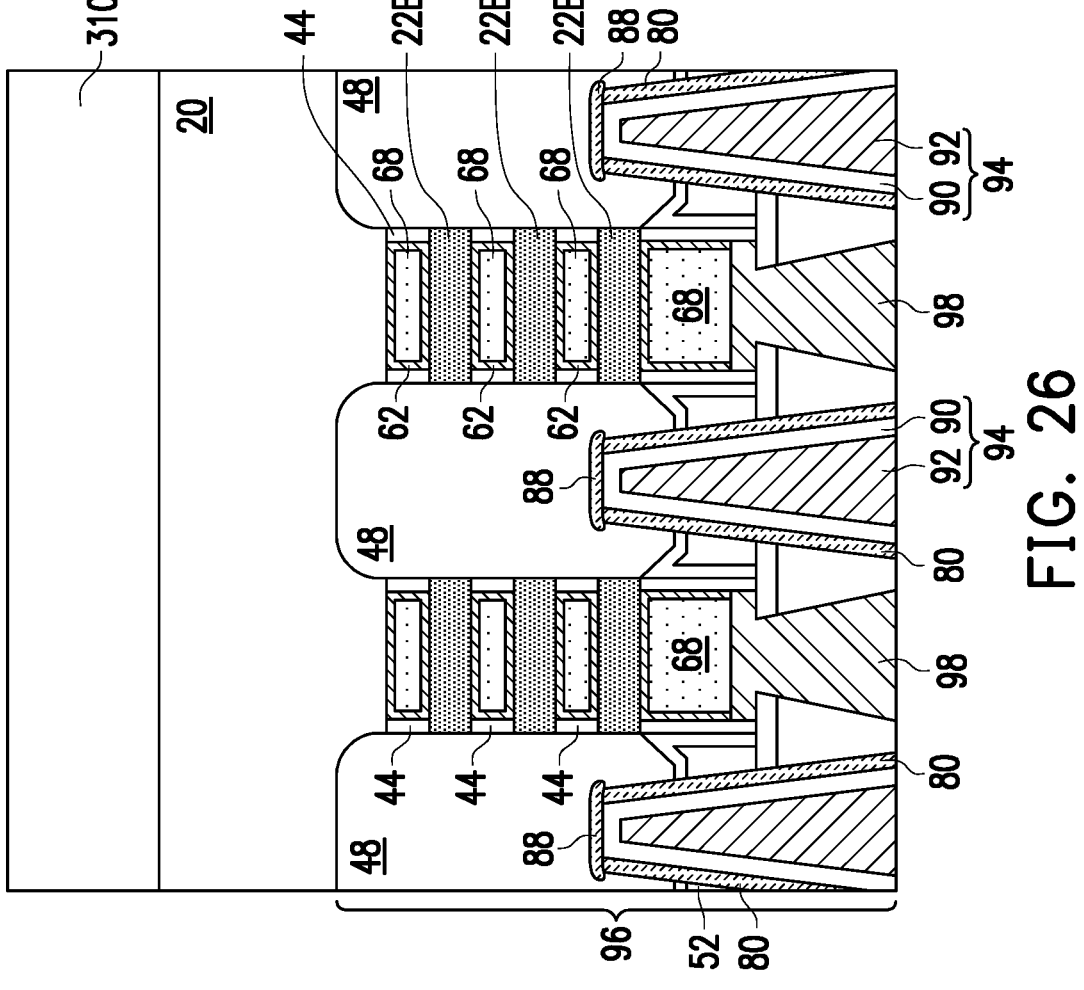

Referring to FIG. 26, a structure is flipped upside down after the formation of the gate contact plugs 98 shown in FIGS. 24A and 24B and the substrate 20 is thinned to a desired thickness by using a planarization process such as a CMP process, a grinding process, an etching process, the like, or a combination thereof. A first hard mask layer 310 is deposited on the thinned side of the substrate 20. The first hard mask layer 310 may be formed of silicon nitride, silicon oxynitride, silicon oxide, silicon oxy-carbo-nitride, or the like, and may be formed using PECVD, CVD, ALD, or the like. Then, a planarization process such as a CMP process or a mechanical grinding process is performed to level a top surface of first hard mask layer 310.

Figure 27:
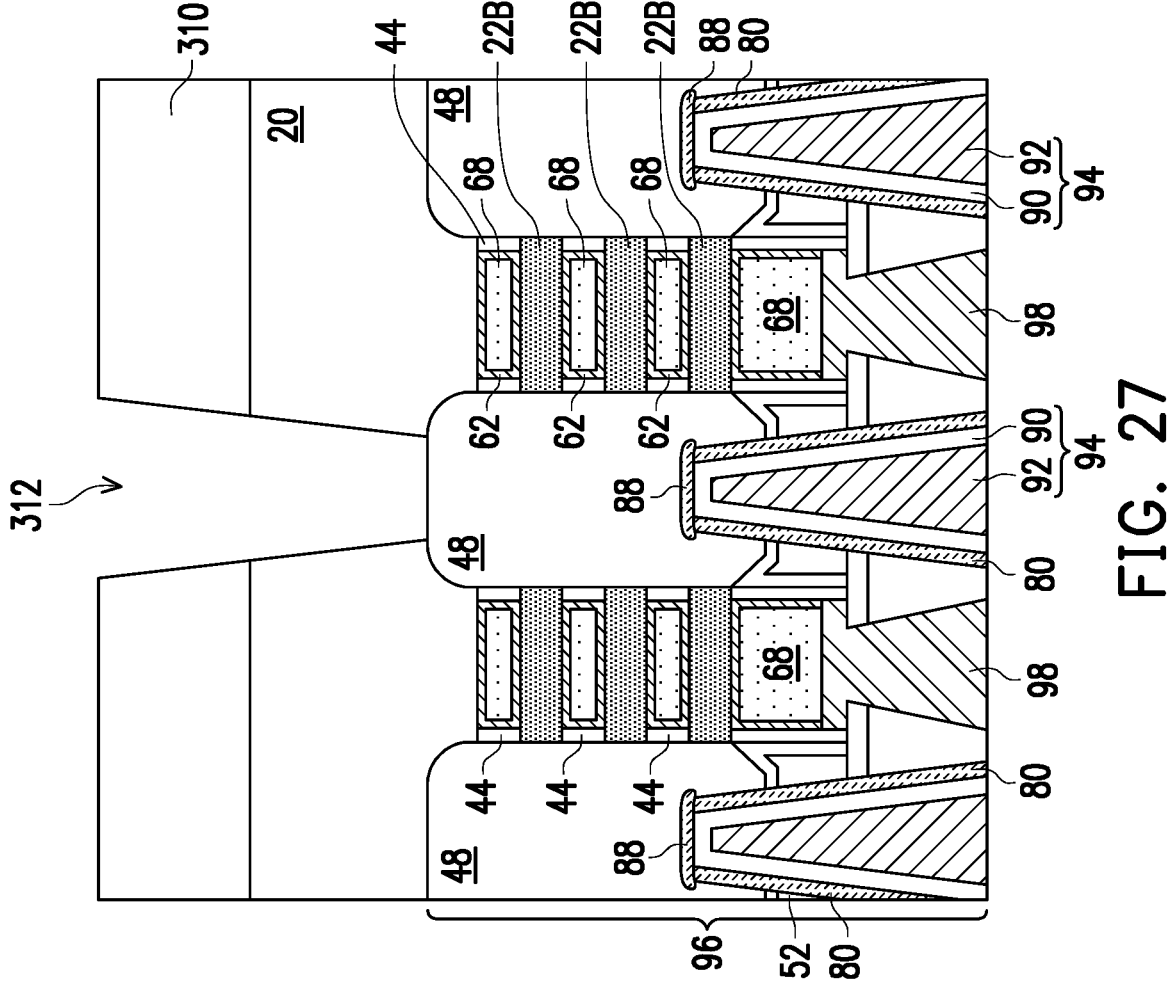

Referring to FIG. 27, the first hard mask layer 310 and the substrate 20 are etched to form a via opening 312. The via opening 312 penetrates through the substrate 20 for revealing an exposed portion of the underlying source/drain regions 48. The etching process may be a dry etching process or a wet etching process, and the etching chemical depends on the material of first hard mask layer 310 and the substrate 20.

Figure 28:
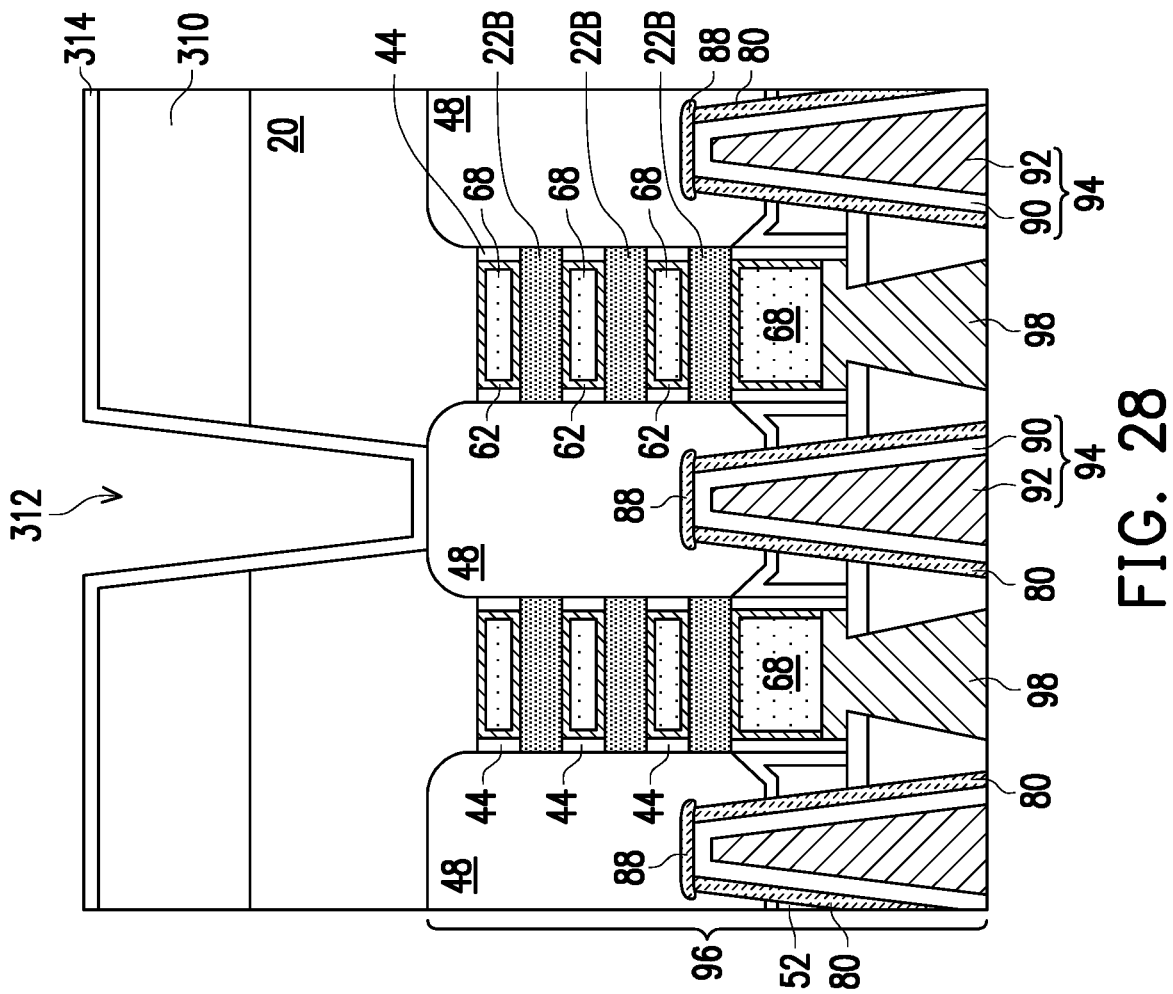

Referring to FIG. 28, the second hard mask layer 314 is conformally formed in the via opening 312 and on the first hard mask layer 310. In accordance with some embodiments, the second hard mask layer 314 is formed of a dielectric material such as silicon nitride, silicon oxynitride, silicon oxide, silicon oxy-carbo-nitride, or the like, and may be formed using PECVD, CVD, ALD, or the like.

Figure 29:
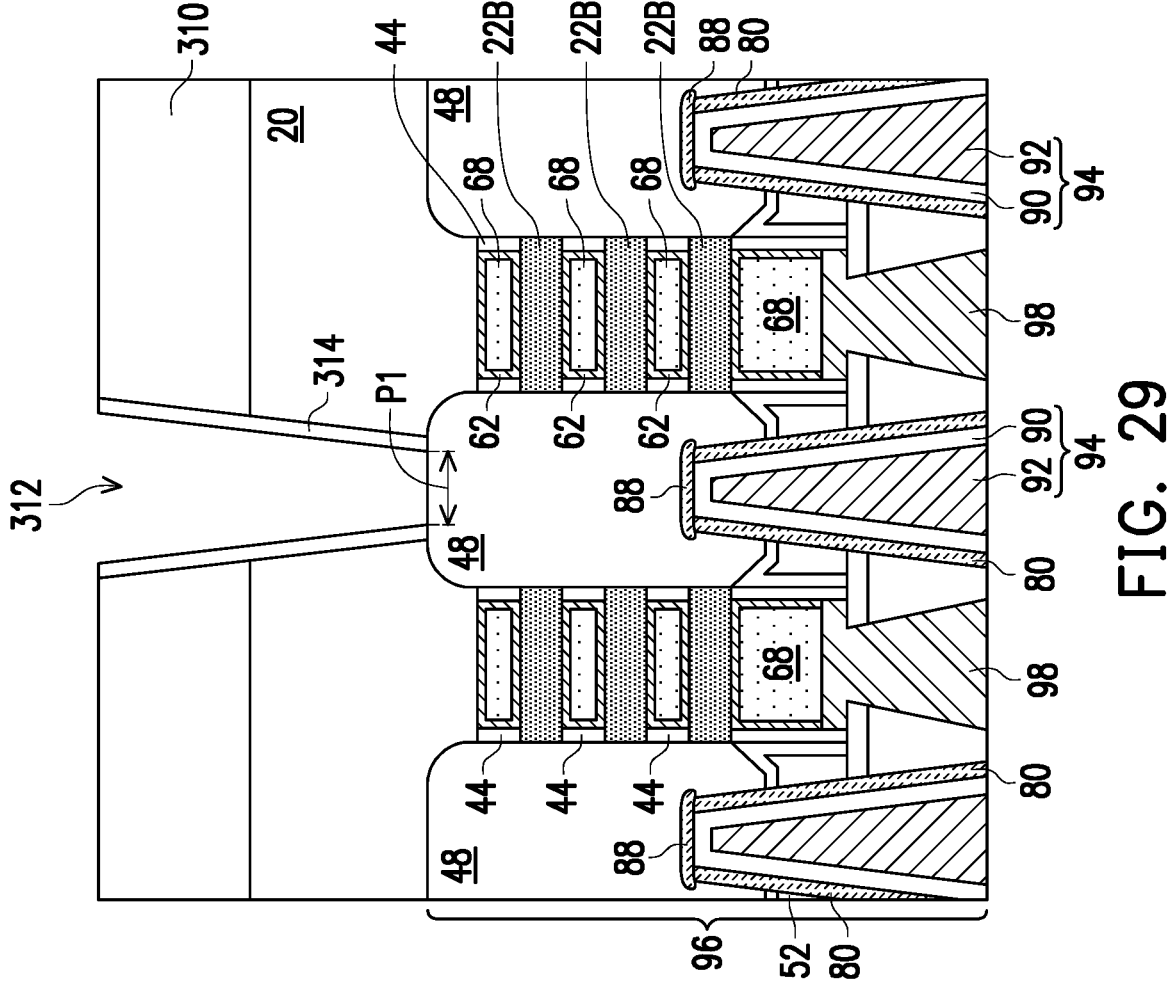

Referring to FIG. 29, an anisotropic etching process is performed to remove horizontal portions of second hard mask layer 314 for revealing an exposed portion P1 of the underlying source/drain regions 48, leaving vertical portions of second hard mask layer 314, which forms a ring.

Figure 30:
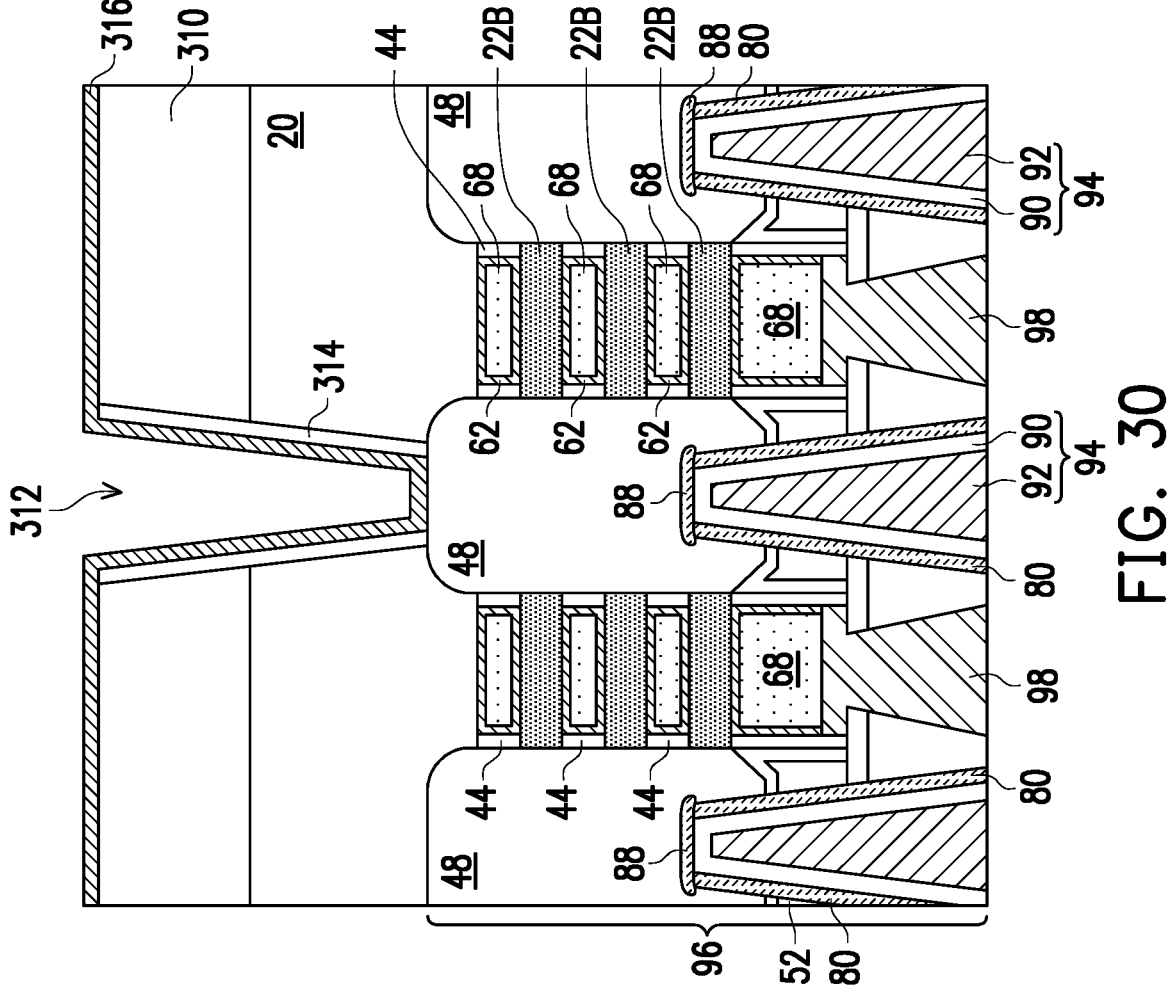

Referring to FIG. 30, a first metal material layer 316 (such as a titanium layer or a tungsten layer, or the like) is deposited in the via opening 312 and on the first hard mask layer 310. The first metal material layer 316 is formed using CVD, PVD, PECVD, or the like. As a result of the conformal deposition process, different portions (such as horizontal portions, vertical portions, and corner portions) of first metal material layer 316 have a uniform thickness or a substantially uniform thickness. The bottom thickness and sidewall thickness of first metal material layer 316 are equal to or close to each other.

Figure 31:
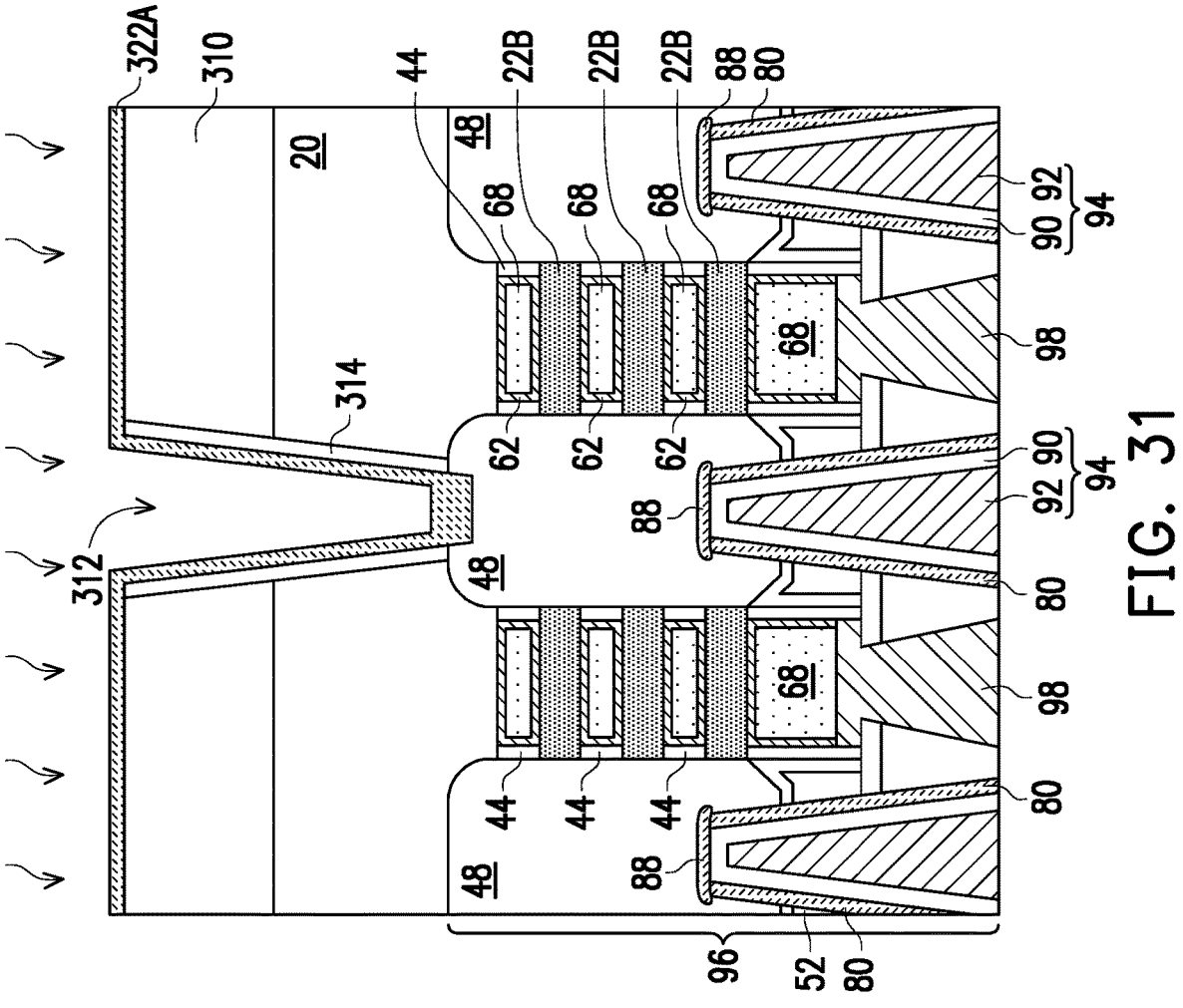

Referring to FIG. 31, an annealing process is performed. In accordance with some embodiments, the annealing process is performed at a temperature in the range between about 400° C. and about 600° C. The deposition of first metal material layer 316 and the annealing process may be in-situ performed in a same environment without vacuum break in between. Due to the elevated temperature for depositing first metal material layer 316, and further due to the annealing process, the bottom portion of first metal material layer 316 react with the exposed portion P1 of the source/drain regions 48, and the sidewall portion of first metal material layer 316 react with the second hard mask layer 314 to form a silicide material layer 322A. A thickness of the bottom portion of silicide material layer 322A is larger than a thickness of the sidewall portion of silicide material layer 322A. In some embodiments, the silicide material layer 322A may be formed of silicide. In some embodiments, the silicide material layer 322A may be formed of NiSi, Na$_2$Si, Mg$_2$Si, PtSi, TiSi$_2$, WSi$_2$, MoSi$_2$, or the like.

Figure 32:
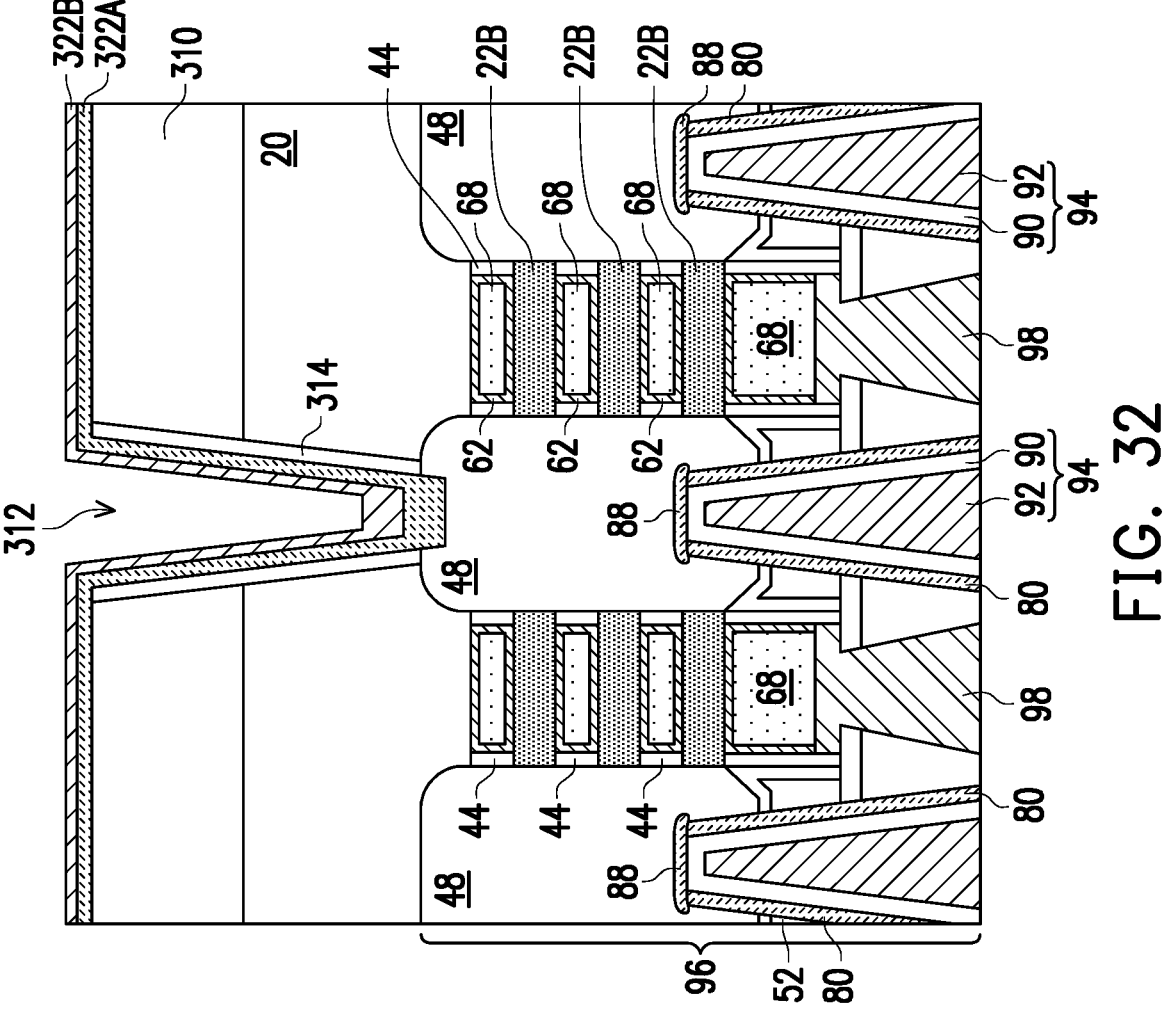

Referring to FIG. 32, a second metal material layer 322B is deposited on the silicide material layer 322A and the first hard mask layer 310. In some embodiments, PVD process is performed to form the second metal material layer 322B at a temperature in the range between about 10° C. and about 400° C. and at a pressure in the range between about 0.1 mtorr and 1 torr. In some embodiments, as a result of the deposition process, vertical portions of second metal material layer 322B may have a thickness greater than corner portions and horizontal portions of second metal material layer 322B. In some embodiments, the second metal material layer 322B may be formed of metal materials such as W, Ru, Co, Mo, or the like.

Referring to FIG. 33, the second metal material layer 322B and the silicide material layer 322A are partially removed by an etching process, to form a capping structure 324 at the bottom portion of the via opening 312. The etching process may be a dry etching process or a wet etching process, and the etching chemical depends on the material of the second metal material layer 322B and the silicide material layer 322A. In some embodiments, the capping structure 324 may be electrically connected to the source/drain region 48. In some embodiments, the capping structure 324 may comprise a silicide layer 324A partially embedded in the source/drain region 48, and a first metallic portion 324B disposed on the silicide layer 324A. In some embodiments, a thickness of the first metallic portion 324B at the bottom portion of the via opening 312 is thinner than a thickness of the second metal material layer 322B at the bottom portion of the via opening 312, duo to the etching process. In some embodiments, the first metallic portion 324B may be spaced apart from the second hard mask layer 314 by the silicide layer 324A. In some embodiments, the silicide layer 324A may comprise a first silicide segment (such as horizontal portions of silicide layer 324A) and a second silicide segment (such as vertical portions of silicide layer 324A) connected with a portion of the first silicide segment. In some embodiments, the first silicide segment may protrude into the source/drain region 48 and partially embedded in the source/drain region 48. In some embodiments, the second silicide segment may be in contact with a sidewall of the first metallic portion 324B. In some embodiments, a topmost surface of the second silicide segment of silicide layer 324A is level with a topmost surface of the first metallic portion 324B.

Figure 34:
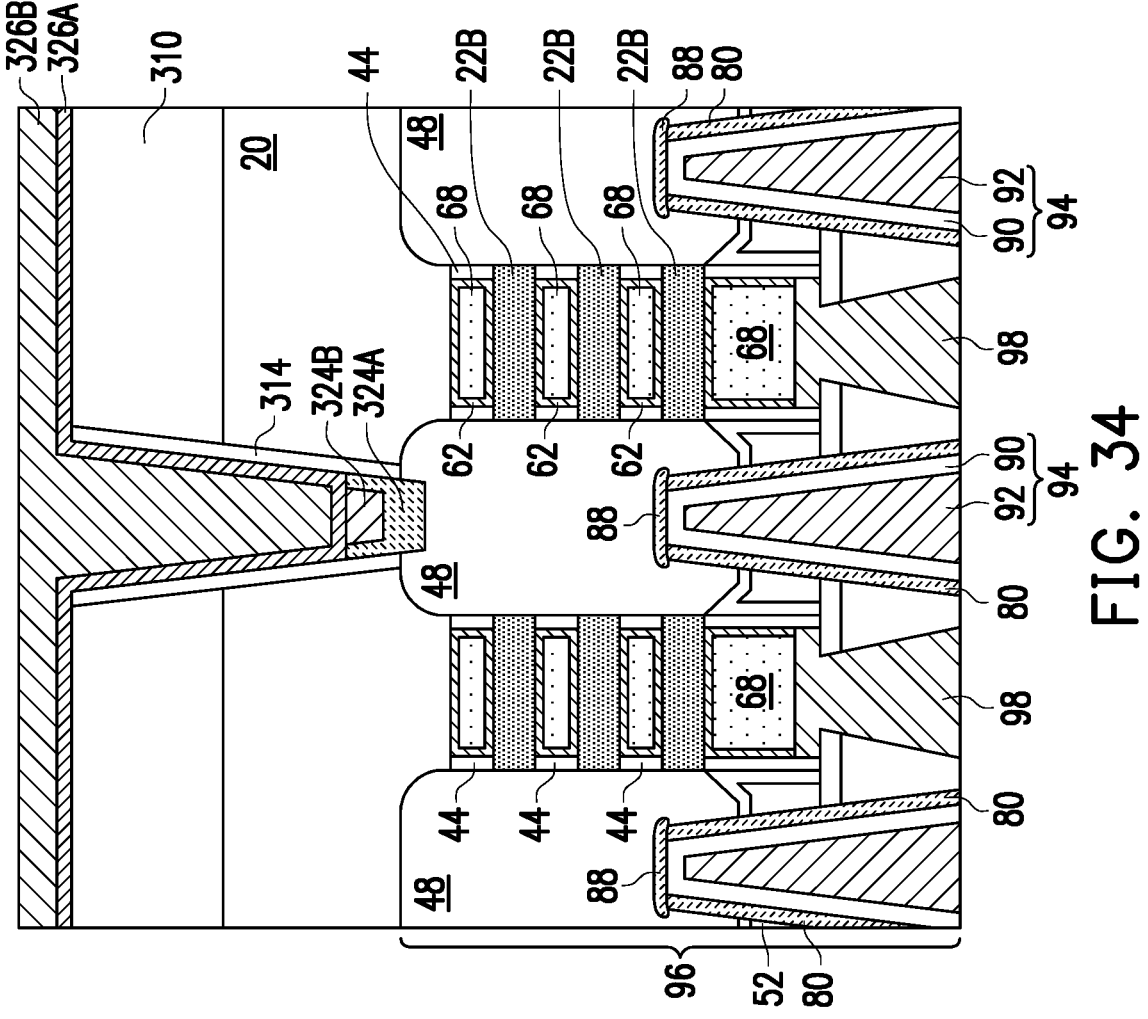

Referring to FIG. 34, a glue material layer 326A is deposited in the via opening 312, and on the capping structure 324, the first hard mask layer 310, and the second hard mask layer 314. In some embodiments, PVD process/or sputtering process is performed to form the glue material layer 326A at a temperature in the range between about 250° C. and about 450° C. and at a pressure in the range between about 1 mtorr and 1 torr. In some embodiments, as a result of the conformal deposition process, different portions (such as horizontal portions, vertical portions, and corner portions) of glue material layer 326A have a uniform thickness or a substantially uniform thickness (the bottom thickness and sidewall thickness of glue material layer 326A are equal to or close to each other). In some embodiments, as a result of the deposition process, vertical portions of glue material layer 326A may have a thickness greater than corner portions and horizontal portions of glue material layer 326A. In some embodiments, the glue material layer 326A may be formed of metal/or metallic materials such as Ru, TaN, TiN, or the like. In some embodiments, materials of the glue material layer 326A and the first metallic portion 324B may be same.

Next, a conductive material layer 326B is deposited on the glue material layer 326A and filled up/or over filled up the via opening 312. In some embodiments, CVD process is performed to form the conductive material layer 326B at a temperature in the range between about 50° C. and about 400° C. and at a pressure in the range between about 1 mtorr and about 5 torr. In some embodiments, chemical precursors of CVD process may be ruthenium-based precursor, cobalt-based precursor, tungsten-based precursor, molybdenum-based precursor, or the like. In some embodiments, the conductive material layer 326B is formed by using materials such as Rux(CO)y, Rux(CO)yClz, Rux(CO)yBrz, or a combination thereof at a temperature about 50° C. to about 250° C. and about 1 mtorr to about 5 torr, in a condition of with or without NH3 and/or H2 treatment. In some embodiments, the conductive material layer 326B is formed by using materials such as CwHxCoyOz at a temperature about 100° C. to about 200° C. and about 1 mtorr to about 5 torr, in a condition of with or without NH3 and/or H2 treatment. In some embodiments, the conductive material layer 326B is formed by using materials such as WxFy at a temperature about 250° C. to about 400° C. and about 1 mtorr to about 5 torr, in a condition of with or without NH3 and/or H2 treatment. In some embodiments, the conductive material layer 326B is formed by using materials such as ClxMoOy, MoxCly, or a combination thereof at a temperature about 50° C. to about 250° C. and about 1 mtorr to about 5 torr, in a condition of with or without NH3 and/or H2 treatment. In some embodiments, the conductive material layer 326B may have metal/or metallic materials such as W, Ru, Co, Cu, Mo, TaN, TIN, or the like.

Referring to FIG. 35, after the filling of the via opening 312, a planarization process such as a CMP process or a mechanical grinding process is performed to partially remove conductive material layer 326B and glue material layer 326A until exposing a top surface of the second hard mask layer 314, to form a conductor 326. In some embodiments, the conductor 326 comprises a glue layer 326A and a second metallic portion 326B. After the CMP process or the mechanical grinding process, the source/drain contact via 320 is also formed in the via opening 312. In some embodiments, the source/drain contact via 320 comprise the silicide layer 324A, the first metallic portion 324B, the glue layer 326A and second metallic portion 326B. In some embodiments, the source/drain contact via 320 penetrates through the substrate 20 and is electrically connected to the source/drain region 48. In some embodiments, the source/drain contact via 320 is spaced apart from the substrate 20 by the second hard mask layer 312.

Next, a series of deposition processes is performed to depositing a first barrier layer 328, a second barrier layer 330 on the first barrier layer 328 and a conductive metal layer 332 on the second barrier layer 330 in an order. The conductive metal layer 332 may be a portion of an interconnection structure electrically connected to other semiconductor devices. In some embodiments, first barrier layer 328 and second barrier layer 330 are formed of a same material. In some embodiments, the first barrier layer 328 and the second barrier layer 330 are formed of a different material. In some embodiments, the first barrier layer 328 may be formed of metal/or metallic materials such as W, Ru, Co, Cu, Mo, TaN, TIN, or the like. In some embodiments, the second barrier layer 330 may be formed of metal/or metallic materials such as W, Ru, Co, Cu, Mo, TaN, TiN, or the like. In some embodiments, the conductive metal layer 332 may be formed of metal/or metallic materials such as W, Ru, Co, Cu, Mo, TaN, TiN, or the like. In some embodiments, the conductive metal layer 332 is formed to a thickness in the range between about 1 nm and about 50 nm. However, any suitable thickness may be utilized while remaining within the scope of the embodiments.

Referring to FIG. 36, FIG. 36 illustrates a partial enlargement view of a portion A of FIG. 35. Some reference symbols and labeled representations of FIG. 35 are omitted in FIG. 36 to clear a structure of the source/drain contact via 320.

In some embodiments, in the source/drain contact via 320, the first metallic portion 324B is spaced apart from the second metallic portion 326B by the glue layer 326A and the first metallic portion 324B is enclosed by the silicide layer 324A and the glue layer 326A. In some embodiments, the second silicide segment (such as vertical portions of silicide layer 324A) extends from the first silicide segment (such as horizontal portions of silicide layer 324A) to the glue layer 326A. In some embodiments, the glue layer 326A comprises a first glue segment (such as horizontal portions of glue layer 326A) and a second glue segment (such as vertical portions of glue layer 326A). In some embodiments, the first glue segment of glue layer 326A is in contact with the first metallic portion 324B and the second silicide segment of silicide layer 324A, and a sidewall of the second metallic portion 326B is in contact with the second glue segment of glue layer 326A. In some embodiments, the second metallic portion 326B is spaced apart from the second hard mask layer 314 by the glue layer 326A. In some embodiments, the second hard mask layer 314 is in contact with the silicide layer 324A and the glue layer 326A.

In some embodiments, a thickness T5 of the first silicide segment (such as the horizontal portions of silicide layer 324A) is in the range between about 1 nm and about 20 nm, and a thickness T6 of the second silicide segment (such as the vertical portions of silicide layer 324A) is in the range between about 0.5 nm and about 10 nm. In some embodiments, a width T7 of a bottom surface of the first metallic portion 324B in contact with the first silicide segment of silicide layer 324A is in the range between about 1 nm and about 39 nm, and a width T8 of a top surface of the first metallic portion 324B in contact with the glue layer 326A is in the range between about 2 nm and about 40 nm. In some embodiments, a height H1 of the first metallic portion 324B extending from the bottom surface of the first metallic portion 324B to the top surface of the first metallic portion 324B is in the range between about 1 nm and about 5 nm.

In some embodiments, a thickness T9 of the first glue segment (such as the horizontal portions of glue layer 326A) is in the range between about 0.3 nm and about 5 nm, and a thickness T10 of the second glue segment (such as the vertical portions of glue layer 326A) is in the range between about 0.3 nm and about 5 nm. In some embodiments, a width T11 of a bottom surface of the second metallic portion 326B in contact with the glue layer 326A is in the range between about 1 nm and about 39 nm, and a width T12 of a top surface of the second metallic portion 326B in contact with the first barrier layer 328 is in the range between about 2 nm and about 40 nm. In some embodiments, a height H2 of the second metallic portion 326B extending from the bottom surface of the second metallic portion 326B to the top surface of the second metallic portion 326B is in the range between about 30 nm and about 60 nm. In some embodiments, a ratio of the height H1 of the first metallic portion 324B to the height H2 of the second metallic portion 326B is 1:6 to 1:60. In some embodiments, a ratio of the height H1 of first metallic portion 324B to the thickness T9 of the first glue segment of glue layer 326A is 1:0.06 to 1:5.

A semiconductor device, and a method of manufacturing thereof are provided. The embodiments of the present disclosure have some advantageous features. In accordance with some embodiments of the present disclosure, a source/drain contact via is formed in a via opening. The source/drain contact via comprises a silicide layer, a first metallic portion, a glue layer and a second metallic portion. The first metallic portion is spaced apart from the second metallic portion by the glue layer. The formation of the source/drain contact via, by using a PVD deposition process to form the first metallic portion on the silicide layer, the first metallic portion protects the silicide layer from damage of the CVD deposition process subsequently. The glue layer also solves the problem introduced by CVD deposition process and improves an adhesion between the source/drain contact via and a sidewall of the hard mask layer. By reducing the damage of the silicide layer and improving the reliability of the source/drain contact via, the performance of the resulting transistors is improved.

In accordance with some embodiments of the present disclosure, a semiconductor device comprises a gate stack, source/drain regions, and a source/drain contact via. The gate stack is disposed on a substrate. The source/drain regions are disposed on the substrate and located at opposite sides of the gate stack. The source/drain contact via penetrates through the substrate and is electrically connected to a first source/drain region among the source/drain regions. The source/drain contact vias comprises a first conductor and a second conductor disposed on the first conductor. The first conductor comprises a silicide layer and a first metallic portion. The second conductor comprises a glue layer and a second metallic portion. The first metallic portion is spaced apart from the second metallic portion by the glue layer.

In accordance with some embodiments of the present disclosure, a semiconductor device comprises a gate stack, source/drain epitaxial regions, and a source/drain contact via. The gate stack is disposed on a substrate. The source/drain epitaxial regions are disposed on the substrate and located at opposite sides of the gate stack. The source/drain contact via penetrates through the substrate and is electrically connected to a first source/drain epitaxial region among the source/drain epitaxial regions. The source/drain contact vias comprise a capping structure and a conductor on the capping structure. A capping structure is electrically connected to the first source/drain epitaxial region. The capping structure comprises a buried portion at least partially embedded in the first source/drain epitaxial region and a first metallic portion disposed on the buried portion. The conductor comprises a glue layer and a second metallic portion. The first metallic portion is spaced apart from the second metallic portion by the glue layer.

In accordance with some embodiments of the present disclosure, a method comprises: forming a transistor over a substrate; forming a via opening penetrating through the substrate for revealing an exposed portion of a source/drain region of the transistor; and forming a source/drain contact via in the via opening. The step of forming the source/drain contact via in the via opening comprises: forming a capping structure on the exposed portion of the source/drain region; and forming a conductor on the capping structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   gate stacks disposed on a semiconductor substrate;
   source/drain regions disposed on the semiconductor substrate and located at opposite sides of each gate stack among the gate stacks;
   a source/drain contact via penetrating through the semiconductor substrate and electrically connected to a first source/drain region among the source/drain regions; and
   a silicon-based hard mask layer laterally between the source/drain contact via and the semiconductor substrate, wherein the source/drain contact via comprises:
      a first conductor comprising a silicide layer and a first metallic portion; and
      a second conductor disposed on the first conductor, wherein the second conductor comprises a glue layer and a second metallic portion, and the first metallic portion is spaced apart from the second metallic portion by the glue layer.

2. The semiconductor device of claim 1, wherein the first metallic portion is enclosed by the silicide layer and the glue layer.

3. The semiconductor device of claim 1, wherein the silicide layer comprises a first silicide segment and a second silicide segment, the first silicide segment protrudes into the first source/drain region, the second silicide segment extends from the first silicide segment to the glue layer, a sidewall of the first metallic portion is in contact with the second silicide segment, and the glue layer is in contact with the second silicide segment.

4. The semiconductor device of claim 3, wherein the glue layer comprises a first glue segment and a second glue segment, the first glue segment is in contact with the first metallic portion and the second silicide segment, and a sidewall of the second metallic portion is in contact with the second glue segment.

5. The semiconductor device of claim 1, wherein the source/drain contact via is spaced apart from the semiconductor substrate by the silicon-based hard mask layer, and wherein the silicon-based hard mask layer extends from a sidewall of the silicide layer to a sidewall of the glue layer.

6. The semiconductor device of claim 5, wherein the first metallic portion is spaced apart from the silicon-based hard mask layer by the silicide layer.

7. The semiconductor device of claim 5, wherein the second metallic portion is spaced apart from the silicon-based hard mask layer by the glue layer.

8. The semiconductor device of claim 5, wherein the silicon-based hard mask layer is in contact with the silicide layer and the glue layer.

9. A semiconductor device, comprising:
   a gate stack disposed on a substrate;
   source/drain epitaxial regions disposed on the substrate and located at opposite sides of the gate stack;
   a source/drain contact via penetrating through the substrate and electrically connected to a first source/drain epitaxial region among the source/drain epitaxial regions; and
   a hard mask layer surrounding and covering the source/drain contact via,
   wherein the source/drain contact via comprises:
      a capping structure electrically connected to the first source/drain epitaxial region, wherein the capping structure comprises a buried portion at least partially embedded in the first source/drain epitaxial region and a first metallic portion disposed on the buried portion, and wherein the buried portion is laterally between the first metallic portion and the hard mask layer; and
      a conductor disposed on the capping structure, wherein the conductor comprises a glue layer and a second metallic portion, the first metallic portion is spaced apart from the second metallic portion by the glue layer, and the first metallic portion is enclosed by the buried portion and the glue layer.

10. The semiconductor device of claim 9, wherein the buried portion comprises a first silicide segment and a second silicide segment, the first silicide segment is embedded in the first source/drain epitaxial region, the second silicide segment extends from the first silicide segment to the glue layer, a sidewall the first metallic portion is in contact with the second silicide segment, and the glue layer is in contact with the second silicide segment.

11. The semiconductor device of claim 10, wherein the glue layer comprises a first glue segment and a second glue segment, the first glue segment is in contact with the first metallic portion and the second silicide segment, and a sidewall of the second metallic portion is in contact with the second glue segment.

12. The semiconductor device of claim 9, wherein the source/drain contact via is spaced apart from the substrate by the hard mask layer.

13. The semiconductor device of claim 12, wherein the first metallic portion is spaced apart from the hard mask layer by the buried portion, and the second metallic portion is spaced apart from the hard mask layer by the glue layer.

14. The semiconductor device of claim 12, wherein the hard mask layer is in contact with the buried portion and the glue layer.

15. A semiconductor device, comprising:
a gate stack disposed on a substrate;
source/drain regions disposed on the substrate and located at opposite sides of the gate stack; and
a source/drain contact via penetrating through the substrate and electrically connected to a first source/drain region among the source/drain regions, the source/drain contact via comprising:
    a first conductor comprising a silicide layer and a first metallic portion surrounded by the silicide layer; and
    a second conductor disposed on the first conductor, wherein the second conductor comprises a glue layer and a second metallic portion surrounded by the glue layer, the silicide layer is spaced apart from the second metallic portion by the glue layer, the silicide layer is in contact with the glue layer, and a bottom surface of the glue layer is in contact with top surfaces of the silicide layer and the first metallic portion.

16. The semiconductor device of claim 15, wherein the silicide layer extends along a sidewall of the first metallic portion and is in contact with the glue layer, the first metallic portion is spaced apart from the second metallic portion by the glue layer, and the first metallic portion is enclosed by the silicide layer and the glue layer.

17. The semiconductor device of claim 15, wherein the silicide layer comprises a first silicide segment and a second silicide segment, the first silicide segment protrudes into the first source/drain region, the second silicide segment extends from the first silicide segment to the glue layer, a sidewall of the first metallic portion is in contact with the second silicide segment, and the bottom surface of the glue layer is in contact with a top surface of the second silicide segment.

18. The semiconductor device of claim 17, wherein the glue layer comprises a first glue segment and a second glue segment, a bottom surface of the first glue segment is in contact with the top surface of the first metallic portion and the top surface of the second silicide segment, and a sidewall of the second metallic portion is in contact with the second glue segment.

19. The semiconductor device of claim 15 further comprising a silicon-based hard mask layer, wherein the source/drain contact via is spaced apart from the substrate by the silicon-based hard mask layer.

20. The semiconductor device of claim 10, wherein the second silicide segment is laterally between the first metallic portion and the hard mask layer.

* * * * *